(12) United States Patent
Xu et al.

(10) Patent No.: US 10,784,333 B2
(45) Date of Patent: Sep. 22, 2020

(54) ELECTRONIC DEVICES HAVING SPIRAL CONDUCTIVE STRUCTURES

(71) Applicant: International Business Machines Corporation, Armonk, NY (US)

(72) Inventors: Peng Xu, Santa Clara, CA (US); Kangguo Cheng, Schenectady, NY (US); Xuefeng Liu, Schenectady, NY (US); Chi-Chun Liu, Altamont, NY (US); Yongan Xu, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/456,610

(22) Filed: Jun. 28, 2019

(65) Prior Publication Data

US 2019/0341444 A1 Nov. 7, 2019

Related U.S. Application Data

(62) Division of application No. 15/911,626, filed on Mar. 5, 2018.

(51) Int. Cl.
*H01L 49/02* (2006.01)
*H01L 21/3105* (2006.01)
*H01L 23/522* (2006.01)

(52) U.S. Cl.
CPC ........ *H01L 28/10* (2013.01); *H01L 21/31056* (2013.01); *H01L 21/31058* (2013.01); *B81C 2201/0149* (2013.01); *H01L 23/5227* (2013.01)

(58) Field of Classification Search
CPC ............. H01L 28/10; B81C 2201/0149; H01F 2017/0073; H01F 2017/0046
See application file for complete search history.

(56) References Cited

U.S. PATENT DOCUMENTS 7,605,081 B2  10/2009  Yang et al.
8,169,050 B2   5/2012  Daley et al.
(Continued)

FOREIGN PATENT DOCUMENTS

JP    2012191134 A  * 10/2012
WO   2017/105445 A1    6/2017

OTHER PUBLICATIONS

Non-Final Office Action received for U.S. Appl. No. 15/911,626 dated Jan. 24, 2019, 17 pages.
(Continued)

*Primary Examiner* — Alia Sabur
(74) *Attorney, Agent, or Firm* — Amin, Turocy & Watson, LLP

(57) ABSTRACT

Techniques for generating enhanced inductors and other electronic devices are presented. A device generator component (DGC) performs directed-self assembly (DSA) co-polymer deposition on a circular guide pattern formed in low-k dielectric film, and DSA annealing to form two polymers in the form of alternating concentric rings; performs a loop cut in the concentric rings to form concentric segments; fills the cut portion with insulator material; selectively removes first polymer, fills the space with low-k dielectric, and planarizes the surface; selectively removes the second polymer, fills the space with conductive material, and planarizes the surface; deposits low-k film on top of the concentric segments and insulator material that filled the loop cut portion; forms vias in the low-k film, wherein each via spans from an end of one segment to an end of another segment; and fills vias with conductive material to form conductive connectors to form substantially spiral conductive structure.

17 Claims, 17 Drawing Sheets

(56) References Cited

U.S. PATENT DOCUMENTS

| | | | |
|---|---|---|---|
| 8,900,964 B2 | 12/2014 | Ding et al. | |
| 9,389,511 B2 | 7/2016 | Schwartz et al. | |
| 2004/0100349 A1* | 5/2004 | Mheen | H01F 17/0006 336/223 |
| 2008/0135956 A1 | 6/2008 | Huber et al. | |
| 2009/0195343 A1* | 8/2009 | Tiemeijer | H01F 17/0006 336/200 |
| 2010/0167214 A1 | 7/2010 | Yoon et al. | |
| 2017/0171979 A1* | 6/2017 | Wang | H01F 27/2804 |
| 2017/0194356 A1 | 7/2017 | Cheng et al. | |

OTHER PUBLICATIONS

Kim et al., "Directed Assembly of High Molecular Weight Block Copolymers: Highly Ordered Line Patterns of Perpendicularly Oriented Lamellae with Large Periods", American Chemical Society, vol. 7, No. 3, 2013, pp. 1952-1960.

Mohan et al., "Simple Accurate Expressions for Planar Spiral Inductances", IEEE Journal of Solidstate Circuits, vol. 34, No. 10, Oct. 1999, pp. 1419-1424.

Scott et al., "High-Performance Inductors Using Capillary Based Fluidic Self-Assembly", Journal of Microelectromechanical Systems, vol. 13, No. 2, Apr. 2004, pp. 300-309.

List of IBM Patents or Applications Treated as Related.

\* cited by examiner

ELECTRONIC DEVICES HAVING SPIRAL CONDUCTIVE STRUCTURES

BACKGROUND

The subject disclosure relates to semiconductor device structures and assembly, and more specifically, to electronic devices having spiral conductive structures.

SUMMARY

The following presents a summary to provide a basic understanding of one or more embodiments of the disclosed subject matter. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, devices, structures, computer-implemented methods, apparatuses, and/or computer program products that can facilitate forming electronic devices comprising spiral conductive structures are provided.

According to an embodiment, a device can comprise an inductor formed over a substrate. The inductor can comprise concentric segments formed of a conductive material and having a defined shape. The inductor also can comprise insulator material situated between the concentric segments and in open regions between respective ends of the concentric segments. The inductor further can comprise respective conductive vias that are associated with respective concentric segments of the concentric segments, wherein the respective concentric segments comprise a first segment and a second segment, and wherein a first conductive via of the respective conductive vias electrically connects the first segment to the second segment.

Another embodiment relates to a method that can comprise forming concentric segments of a conductive material, wherein the concentric segments have a defined shape. The method can also comprise depositing at least one of a first insulator material or a second insulator material between at least one of the concentric segments or open regions formed between respective ends of the concentric segments. Further, the method can comprise connecting respective conductive connectors to a portion of the respective ends of the concentric segments to facilitate creating an inductor.

A further embodiment relates to a semiconductor chip that can comprise concentric semi-circular segments created using a conductive material. The semiconductor chip can also comprise insulator material that is situated between the concentric semi-circular segments and in open regions located between respective ends of the concentric semi-circular segments. Further, the semiconductor chip can comprise respective conductive connector components that are associated with respective concentric semi-circular segments of the concentric semi-circular segments, wherein the respective concentric semi-circular segments comprise a first semi-circular segment and a second semi-circular segment, and wherein a conductive connector component of the respective conductive connector components connects the first semi-circular segment to the second semi-circular segment.

These and other features will become apparent from the following detailed description of illustrative embodiments thereof, which is to be read in connection with the accompanying drawings.

DETAILED DESCRIPTION

Figure 1:
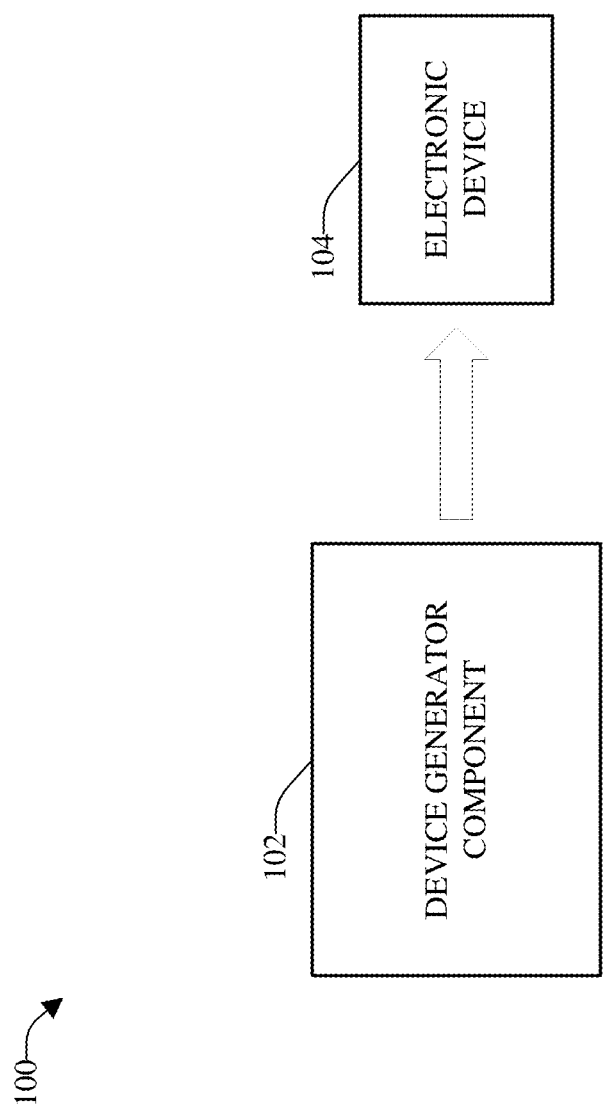
FIG. 1 illustrates a block diagram an example, non-limiting system that can be employed to generate inductors or other types of electronic devices, in accordance with various aspects and embodiments of the disclosed subject matter.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

As advancements are made in electronic technology, the size of semiconductor chips, such as complementary metal-oxide-semiconductor (CMOS) chips, increasingly becomes smaller. To achieve desired electronic functionality in semiconductor chips, it can be desirable to be able to have or form a relatively large amount of electronic components, such as, for example, inductors, and electronic components of various sizes on a semiconductor chip. Employing techniques, such as direct print patterning to create electronic components, like inductors, on semiconductor chips can be inefficient, can result in undesirably larger component sizes, and/or can result in undesirable component performance.

The various embodiments described herein relate to generating enhanced inductors and other enhanced electronic devices. A device generator component can deposit a low-k dielectric film on a pre-built device level(s) and form a circular guide pattern in the film, wherein a circular notch or region, comprising the low-k dielectric film, can remain in the center of the circular guide pattern. The device generator component can perform a directed-self assembly (DSA) co-polymer deposition on the circular guide pattern, and DSA annealing on the co-polymer material to form two polymers in the form of alternating concentric rings that can surround the circular notch of low-k dielectric film. The device generator component can perform a loop cut in a portion of the concentric rings to form concentric segments (e.g., concentric semi-circular segments) and can fill the loop cut region with an insulator material (e.g., an oxide-based insulator material).

The device generator component can selectively remove the first polymer from the concentric segments that contain the first polymer to form a space between the respective concentric segments formed of the second polymer, fill such space with a low-k dielectric, and planarize a top surface (e.g., perform chemical-mechanical planarization (CMP) on the surface) of the concentric segments formed of the second polymer material, the concentric segments formed of the low-k dielectric material, the insulator material in the loop cut region, and/or the low-k dielectric film of the circular notch. The device generator component can selectively remove the second polymer to form a space between the respective concentric segments formed of the low-k dielectric material, fill such space with a conductive material (e.g., a copper-based material), and planarize a top surface of the concentric segments formed of the low-k dielectric material, the concentric segments formed of the conductive material, the insulator material in the loop cut region, and/or the low-k dielectric film of the circular notch. The device generator component can deposit a low-k film on top of the respective concentric segments (e.g., segments formed of conductive material, and segments formed of low-k dielectric material) and insulator material that filled in the loop cut portion.

The device generator component can form vias in the low-k film, wherein each via can span from an end of one concentric segment (e.g., concentric segment of conductive material) across the insulator material of the loop cut region to an end of another concentric segment (e.g., another concentric segment of conductive material). The device generator component can fill the vias with conductive material to form conductive connectors (e.g., conductive vias) to form a substantially spiral conductive structure. When the electronic device, comprising the substantially spiral conductive structure, is an inductor device, the inductor device can enhance (e.g., increase) the number of turns or rings of the inductor per a given area, can correspondingly reduce the pitch of the inductor, and can enhance (e.g., increase) the inductance level produced by an inductor spanning the given area.

These and other aspects and embodiments of the disclosed subject matter will now be described with respect to the drawings.

FIG. 1 illustrates a block diagram an example, non-limiting system 100 that can be employed to generate inductors or other types of electronic devices, in accordance with various aspects and embodiments of the disclosed subject matter. The system 100 can comprise a device generator component 102 that can be utilized to generate an electronic device 104 that can comprise an enhanced spiral structure (e.g., enhanced spiral conductive structure) for use in providing a desired electronic functionality (e.g., producing desirable inductance, or providing another desired electronic functionality). In some embodiments, the electronic device 104 can be or can comprise an inductor. For example, the electronic device 104 can be a device that can comprise various types of electronic and/or mechanical components and/or functions, wherein the electronic device 104 can comprise one or more inductors. As another example, the electronic device 104 can be an inductor or can be a device that can primarily comprise an inductor. In other embodiments, the electronic device 104 can be another type of electronic device, with or without an inductor, that can employ the enhanced spiral structure for a desired utility or application.

It is to be appreciated and understood that, while a number of aspects, embodiments, and features of the disclosed subject matter are described herein with regard to an inductor, the disclosed subject matter is not so limited, and various aspects, embodiments, and features of the disclosed subject matter can be applicable to other types of electronic devices, besides inductors, and the disclosed subject matter can be utilized to generate such other types of electronic devices.

Figure 2:
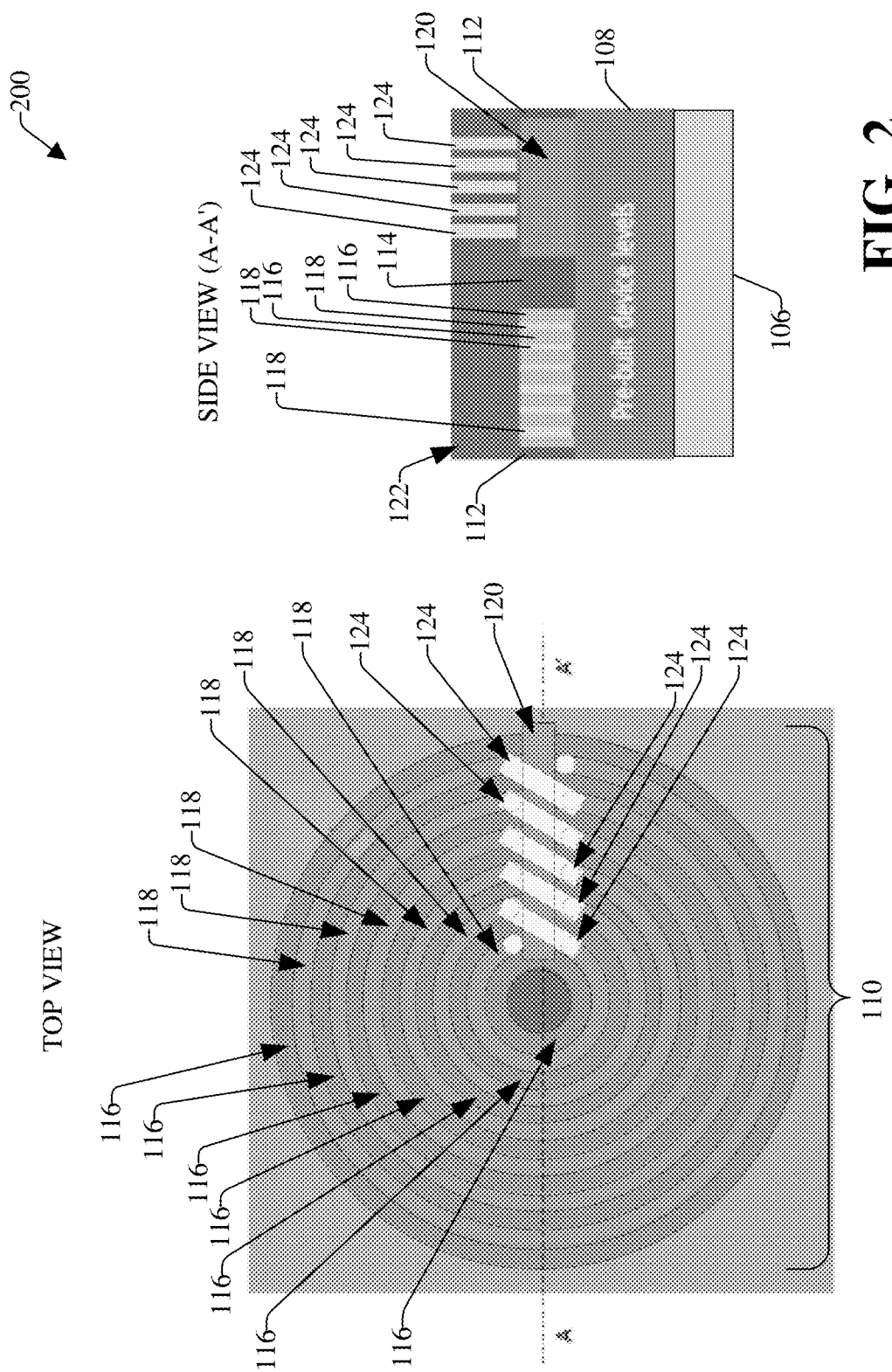
FIG. 2 depicts a diagram of a top view and side view of an example electronic device comprising an enhanced spiral structure, in accordance with various aspects and embodiments of the disclosed subject matter.

The device generator component 102 can employ DSA processes (e.g., co-polymer deposition, DSA annealing, . . . ) and other processes to facilitate creating the enhanced spiral structure of the electronic device 104, as more fully described herein. Referring to FIG. 2 (along with FIG. 1), FIG. 2 depicts a diagram of a top view and side view (A-A' view) of an example electronic device 104 comprising an enhanced spiral structure, in accordance with various aspects and embodiments of the disclosed subject matter. The electronic device 104 can comprise a layered structure (e.g., layered stack structure) that can be formed on a substrate 106 by the device generator component 102. The material used for the substrate 106 can vary. In an aspect, the substrate 106 can comprise a silicon wafer. In some embodiments, the substrate 106 can comprise silicon dioxide on top of a silicon wafer. In other embodiments, the substrate can comprise a compound semiconductor, such as, for example, Indium gallium arsenide (InGaAs) or indium phosphide (InP).

The device generator component 102 can generate, form, or build one or more pre-built device levels 108 (e.g., one or more layers comprising respective electronic components) on the electronic device 104, wherein the one or more pre-built device levels 108 can be formed on the substrate 106. The one or more pre-built device levels 108 can comprise transistors, wiring, and/or other electronic components that can be formed on the respective levels (e.g., layers) of the one or more pre-built device levels 108. The transistors, wiring, and/or other electronic components of the one or more pre-built device levels 108 can be structured and arranged to form desired electronic circuitry that can perform desired electronic functions of the electronic device 104.

The device generator component 102 can generate, form, or build an enhanced spiral structure 110 (e.g., an enhanced spiral or substantially spiral structure) that can be part of the electronic device 104, wherein the enhanced spiral structure 110 can be formed on a pre-built device level 108 (e.g., the top pre-built device level), and wherein the enhanced spiral structure 110 can be formed in a circular guide pattern that can be formed in a low-k dielectric film layer 112 that was deposited on the pre-built device level 108, as more fully described herein. In some embodiments, the forming of the circular guide pattern in the low-k dielectric film layer 112 can include selective application of low-k dielectric material to the top surface of the top pre-built device level 108, or selective removal of low-k dielectric material from the low-k dielectric film layer 112 deposited on the top pre-built device level 108, to have the circular guide pattern remain and defined by (e.g., surrounded or bounded by) the low-k dielectric material (e.g., the applied or remaining low-k dielectric material) of the low-k dielectric film layer 112, wherein the circular guide pattern can include a center region 114 (e.g., a circular region) that can be in the center, or at least can be substantially in the center, of the circular guide pattern.

The low-k dielectric material can comprise virtually any type of dielectric material that has a sufficiently low dielectric constant value (e.g., dielectric constant k<3.9) relative to silicon oxide. The low-k dielectric material can be, for example, a dielectric material comprising atoms of at least silicon (Si), carbon (C), oxygen (O), and hydrogen (H) (e.g., a SiCOH-type dielectric material); methylsilane (CH3-SiH3); tetramethylsilane (Si(CH3)4); and/or another desired (e.g., suitable, acceptable, or optimal) low-k dielectric material. The low-k dielectric film layer 112 can have a desired thickness, which can range from 50 nanometers (nm) to 500 nm, for example. The low-k dielectric film layer 112 can be formed using a desired process, wherein the desired process can comprise, but is not limited to, a physical vapor deposition process, a chemical vapor deposition process, a spin-on deposition process, or a combination thereof.

The enhanced spiral structure 110 can be sized and shaped (e.g., circular or substantially circular) to cover (e.g., to span) a desired amount of area of the electronic device 104. For example, the enhanced spiral structure 110 can have a diameter that can be on the order of tens of microns (e.g., the diameter can typically range up to 100 microns, or can even be larger than 100 microns). The enhanced spiral structure 110 can have a desired and defined height.

The device generator component 102 can create or form the enhanced spiral structure 110 to have the enhanced spiral structure 110 comprise respective concentric segments (e.g., semi-circular segments), which can include a first type of concentric segments 116 that can be formed of an insulator material (e.g., a desired low-k dielectric material) and a second type of concentric segments 118 that can be formed of a desired conductive material (e.g., copper (Cu), a copper-based material, or other conductive material). Respective concentric segments 118 of the second type can be interspersed or interposed between respective concentric segments 116 of the first type, for example, as illustrated in FIG. 2. The respective concentric segments 118 and respective concentric segments 116 can each have respective ends (e.g., segment ends) to form open regions of the respective concentric segments 118 and respective concentric segments 116. As more fully described herein, the open regions can be formed or defined by, and located in, a loop cut region by the device generator component 102, wherein the device generator component 102 can fill the loop cut region with a desired insulator material 120, such as, for example, silicon oxide, silicon oxynitride, carbon-doped silicon oxide, another desired oxide-based material, or another type of insulator material. The device generator component 102 can planarize at least the surface of the insulator material 120 of the loop cut region, using a desired planarization process (e.g., CMP).

It is to be appreciated and understood that, the first type of concentric segments 116 comprising an insulator material and the second type of concentric segments 118 comprising the desired conductive material can be formed or derived as a result of various processes, including DSA processes and material removal or stripping (e.g., selective removal or stripping) processes, and/or other processes, as more fully described herein.

In some embodiments, the device generator component 102 can form or deposit a dielectric film layer 122 on top of the respective concentric segments 116, respective concentric segments 118, the insulator material 120 of the loop cut region, and center region 114. The dielectric film layer 122 can have a desired thickness, which can range from 50 nm to 500 nm, for example. In certain embodiments, the dielectric film layer 122 can be formed using a desired low-k dielectric material or another type of insulating material (e.g., an electrically insulating material).

The device generator component 102 can form, cut, or etch vias in the dielectric film layer 122, wherein each via can span from an end of one concentric segment 118 (e.g., concentric segment formed of conductive material) across the insulator material 120 of the loop cut region to an end of another (e.g., an adjacent or a proximately located) concentric segment 118 (e.g., concentric segment formed of conductive material and adjacent or proximately located to the one concentric segment 118 associated with the same via). The device generator component 102 can fill the vias with conductive material to form conductive connectors 124 (e.g., conductive vias) to facilitate forming the enhanced spiral structure 110 (e.g., a spiral or substantially spiral conductive structure). To form the conductive connectors 124, the vias can be filled with a desired conductive material (e.g., a metal) including, but not limited to, copper, indium-tin oxide, indium-zinc oxide, aluminum-zinc oxide, titanium, aluminum molybdenum, cobalt, silver, gold, nickel, tungsten, chromium, hafnium, platinum, iron, and/or their alloys.

The device generator component 102 can planarize respective surfaces (e.g., respective top or open facing surfaces) of the conductive connectors 124 and/or the dielectric film layer 122 of the electronic device 104. In some embodiments, the device generator component 102 can perform CMP on the respective surfaces of the conductive connectors 124 and/or dielectric film layer 122, although in other embodiments, the device generator component 102 can employ another type (e.g., a suitable type) of planarization process to planarize or polish the respective surfaces of the dielectric film layer 122 and conductive connectors 124 of the electronic device 104.

The enhanced spiral structure 110 of the electronic device 104 can comprise a spiraling conductive formation that can comprise a desired (e.g., enhanced or improved) number of turns or loops over a given area, a desirably reduced (e.g., an improved reduction in) pitch between respective concentric segments 118 of the enhanced spiral structure 110, and, with respect to an inductor, can enhance (e.g., increase) the inductance level produced by an inductor spanning the given area. For example, for a given chip area of approximately 2.5 µm×2.5 µm, an electronic device 104 structured as an inductor, with a circular or substantially circular shape, can have a pitch of 60 nm and an inductance of 0.34 nanohenries (nH), whereas, for that same given chip area, another type of inductor, having a square inductor shape and formed using direct print patterning, can have a pitch of 100 nm and an inductance of 0.16 nH.

It is to be appreciated and understood that, while the concentric rings are often described herein as being circular in shape, and the concentric segments derived from the concentric rings are often described herein as being semi-circular in shape, the disclosed subject matter is not so limited. In some embodiments, the device generator component 102 can create the rings or segments to have a different shape, such as rectangular or square rings and/or semi-rectangular or semi-square segments. It is to be further appreciated and understood that the enhanced spiral structure 110, with the semi-circular segments, disclosed herein, can be structured more efficiently and can operate more efficiently (e.g., can have a smaller pitch, can provide a higher inductance, for a given chip area), as compared to inductors having different shapes (e.g., rectangular, square), even when DSA processes are employed for such different shapes, and even more so when other types of processes (e.g., direct print patterning) are employed.

These and other embodiments and aspects relating to the formation of the electronic device will be further described with regard to the other drawings.

Figure 3:
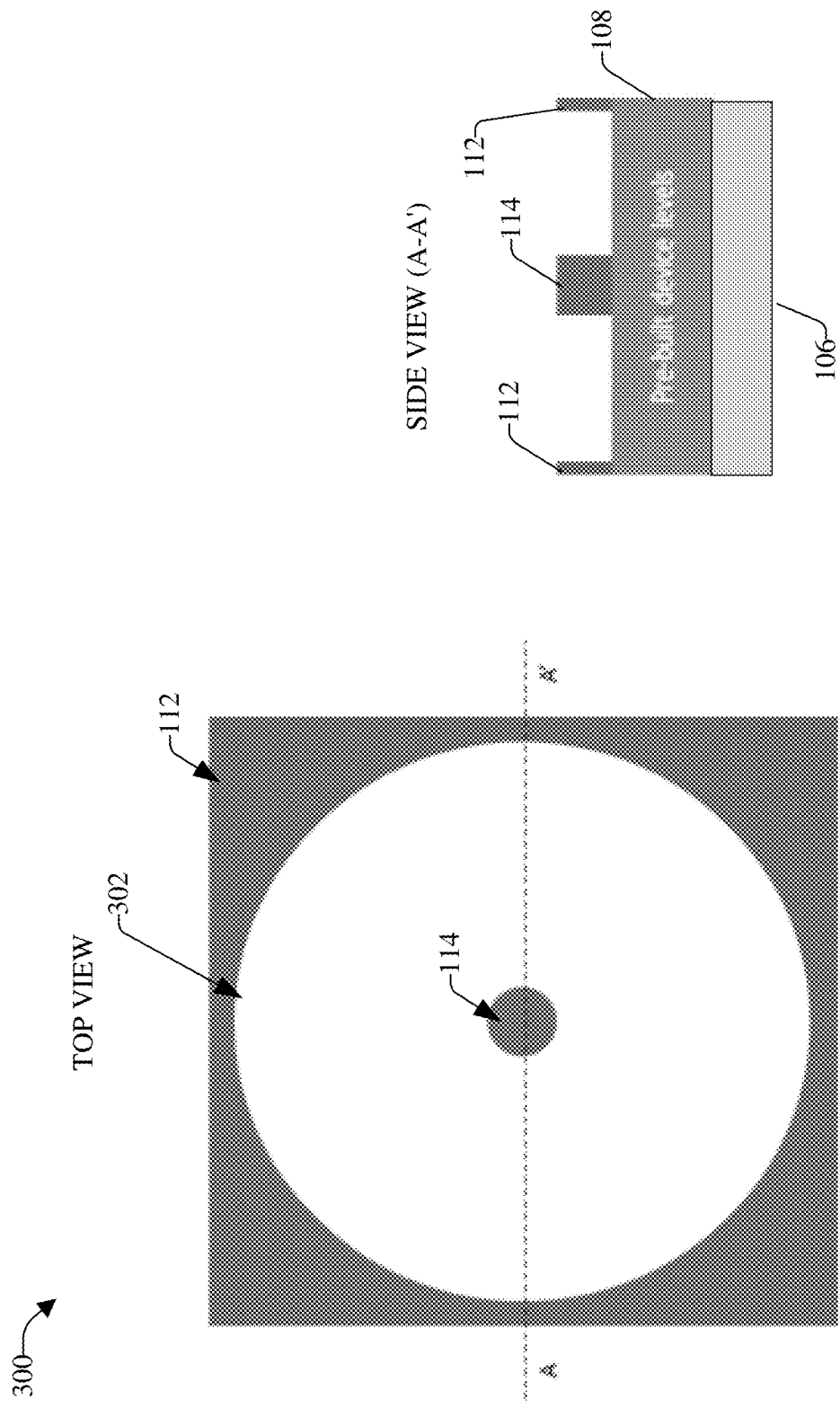
FIG. 3 illustrates a diagram of a top view and side view of an example portion of the electronic device during fabrication of the electronic device, in accordance with various aspects and embodiments of the disclosed subject matter.

Referring briefly to FIG. 3 (along with FIG. 1), FIG. 3 illustrates a diagram of a top view and side view (A-A' view) of an example portion 300 of the electronic device 104 during fabrication (e.g., creation, formation) of the electronic device 104, in accordance with various aspects and embodiments of the disclosed subject matter. Repetitive description of like elements employed in other embodiments described herein is or may be omitted for sake of brevity.

In accordance with the electronic-device fabrication process and the example portion 300 of the electronic device 104, the device generator component 102 can generate, form, or build one or more pre-built device levels 108 on the substrate 106 of the electronic device 104, as more fully described herein. The device generator component 102 can form or deposit the low-k dielectric film layer 112 on a top level (e.g., a top surface of a top level) of the one or more pre-built device levels 108. In some embodiments, the device generator component 102 can selectively apply (e.g., form, deposit) the low-k dielectric film layer 112 to portions of the top pre-built device level 108 to form a desired circular guide pattern 302 having a desired size, with the circular guide pattern 302 comprising the center region 114. In other embodiments, the device generator component 102 can apply the low-k dielectric material on the top surface of the top pre-built device level 108 and can selectively remove desired portions of the low-k dielectric material to create the circular guide pattern 302 and center region 114 using a desired material removal process. While the low-k dielectric film layer 112 is described herein as being comprised of low-k dielectric material, it is to be appreciated and understood that other types of materials (e.g., other types of insulating materials) can be used in other embodiments, in accordance with the disclosed subject matter. This can facilitate preparing for the DSA process and other processes that can be performed to facilitate creating the electronic device 104, as disclosed herein.

Figure 4:
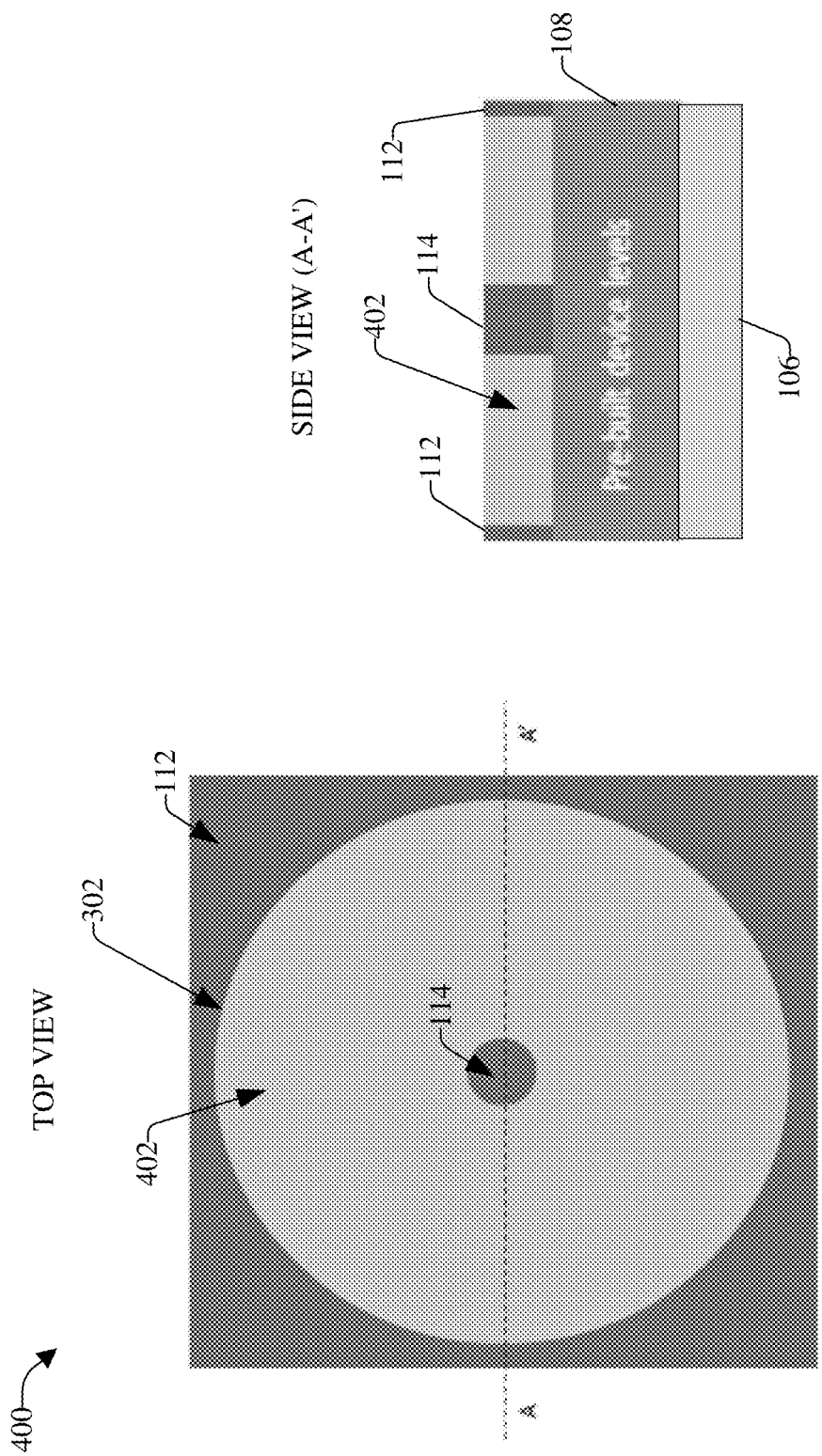
FIG. 4 presents a diagram of a top view and side view of an example portion of the electronic device during fabrication, wherein the electronic-device fabrication process can comprise using directed-self assembly (DSA) co-polymer deposition to facilitate generating the electronic device, in accordance with various aspects and embodiments of the disclosed subject matter.

Turning to FIG. 4 (along with FIG. 1), FIG. 4 presents a diagram of a top view and side view (A-A' view) of an example portion 400 of the electronic device 104 during fabrication (e.g., creation, formation) of the electronic device 104, wherein the electronic-device fabrication process can comprise using DSA co-polymer deposition to facilitate generating (e.g., creating, forming) the electronic device 104, in accordance with various aspects and embodiments of the disclosed subject matter. Repetitive description of like elements employed in other embodiments described herein is or may be omitted for sake of brevity.

In accordance with the electronic-device fabrication process and the example portion 400 of the electronic device 104, the device generator component 102 can utilize a DSA process (e.g., DSA block copolymer deposition process) to deposit a co-polymer material 402 (e.g., polystyrene-polymethylmethacrylate (PS-PMMA), polystyrene-polydimethylsiloxane (PS-PDMS), polystyrene-poly(2-vinylpyridine) (PS-P2VP) or other desirable (e.g., suitable, acceptable, or optimal) co-polymer material) into the circular guide pattern 302 that can be defined in part by the low-k dielectric material (e.g., applied or remaining low-k dielectric material) of the low-k dielectric film layer 112 and center region 114 formed on the top surface of the top pre-built device level 108. The co-polymer material 402 can comprise a combination of multiple polymer materials (e.g., two (or more) co-polymer materials), wherein the co-polymer material 402 can facilitate the generation of respective concentric rings of respective co-polymer materials, as more fully described herein. The thickness of the co-polymer material 402 can be the same as, or substantially the same as, the thickness of the low-k dielectric film layer 112.

Figure 5:
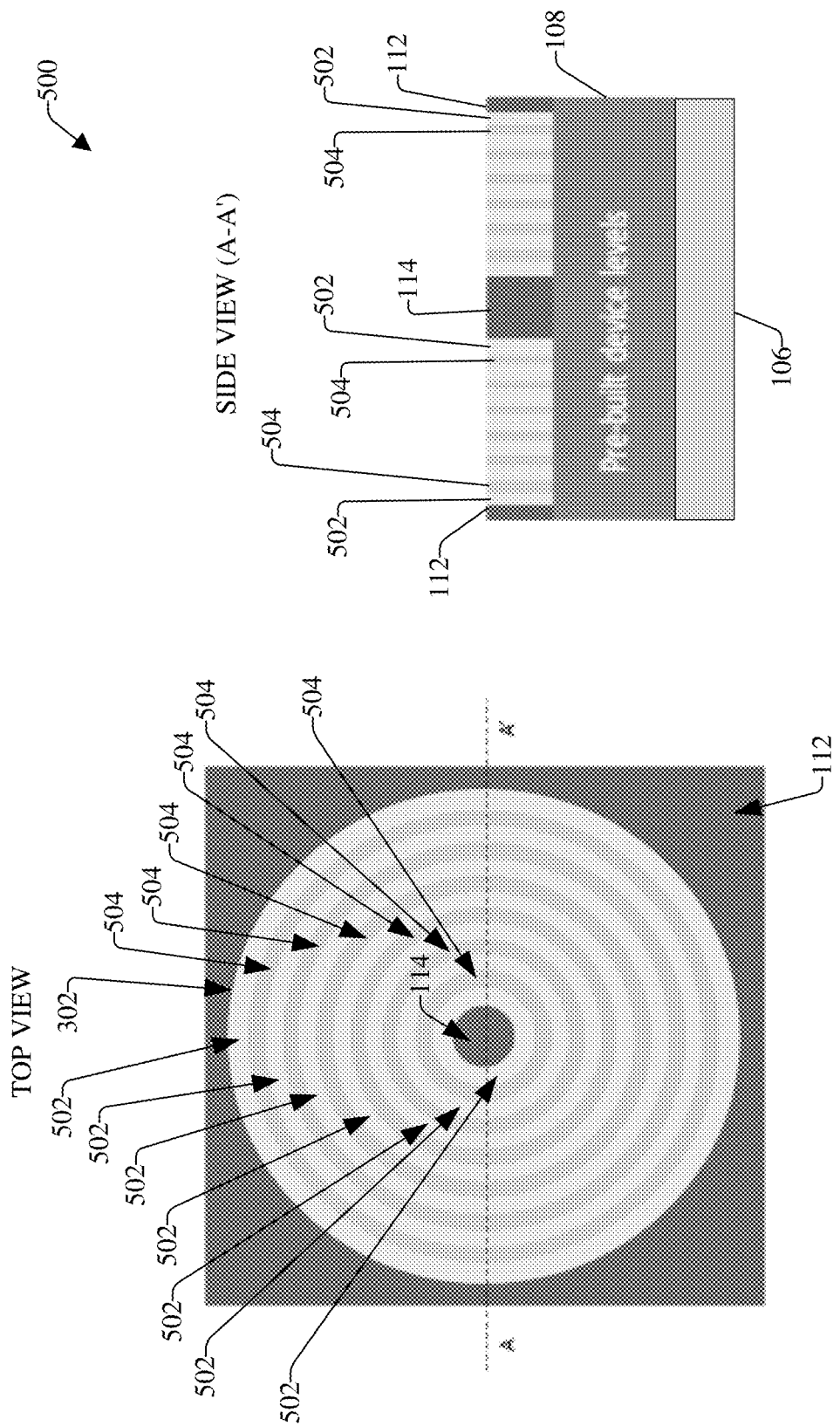
FIG. 5 illustrates a diagram of a top view and side view of an example portion of the electronic device during fabrication, wherein the electronic-device fabrication process can comprise using DSA annealing to form respective concentric rings of respective polymer materials to facilitate generating the electronic device, in accordance with various aspects and embodiments of the disclosed subject matter.

Referring to FIG. 5 (along with FIG. 1 and FIG. 4), FIG. 5 illustrates a diagram of a top view and side view (A-A' view) of an example portion 500 of the electronic device 104 during fabrication of the electronic device 104, wherein the electronic-device fabrication process can comprise using DSA annealing to form respective concentric rings of respective polymer materials to facilitate generating (e.g., creating, forming) the electronic device 104, in accordance with various aspects and embodiments of the disclosed subject matter. Repetitive description of like elements employed in other embodiments described herein is or may be omitted for sake of brevity.

In accordance with the electronic-device fabrication process and the example portion 500 of the electronic device 104, the device generator component 102 can perform DSA annealing on the co-polymer material 402 (of FIG. 4) to create (e.g., generate, form) respective concentric rings of respective polymer materials formed or located in the circular guide pattern 302, which can be defined in part by the low-k dielectric material (e.g., the applied or remaining low-k dielectric material) of the low-k dielectric film layer 112 and center region 114 formed on the top surface of the top pre-built device level 108, wherein the respective polymer materials can be derived from the co-polymer material 402. Through the DSA processes performed by the device generator component 102, the co-polymer material 402 can be transformed and the respective polymer materials of the co-polymer material 402 can undergo a directed-self assembly to form the respective concentric rings of the respective polymer materials.

The respective concentric rings can comprise a first subset (e.g., type) of concentric rings comprising concentric rings 502 of a first polymer material and a second subset (e.g., type) of concentric rings comprising concentric rings 504 of a second polymer material, wherein the first polymer material can be different from the second polymer material. The respective concentric rings (e.g., 502, 504) can progressively extend or expand out from the center region 114 through the circular guide pattern 302 to the outer end of the circular guide pattern 302 that can be framed or defined by the outer portion of the low-k dielectric film layer 112 (e.g., the outer portion of the applied or remaining low-k dielectric material of the low-k dielectric film layer 112), wherein the concentric rings can be arranged in an alternating manner such that the concentric rings 504 can be interspersed or interposed between respective concentric rings 502.

In some embodiments, the first subset concentric rings 502 can be formed of a poly(methyl methacrylate) (PMMA) material, and the second subset of concentric rings 504 can be formed of a polystyrene (PS) material. In other embodiments, the first subset concentric rings 502 can be formed of another type of polymer material, and/or the second subset of concentric rings 504 can be formed of still another type of polymer material that can be different from the polymer material of the first subset of concentric rings.

It is to be appreciated and understood that, while the disclosed subject matter describes using DSA processes to create the respective concentric rings of respective polymer materials (e.g., concentric rings alternating between a first-type ring (e.g., 502) of one polymer material and a second-type ring (e.g., 504) having a different polymer material), the disclosed subject matter is not so limited, and the disclosed subject matter (e.g., the device generator component 102) can employ any suitable process(es) to form the respective concentric rings of respective polymer materials described herein.

Figure 6:
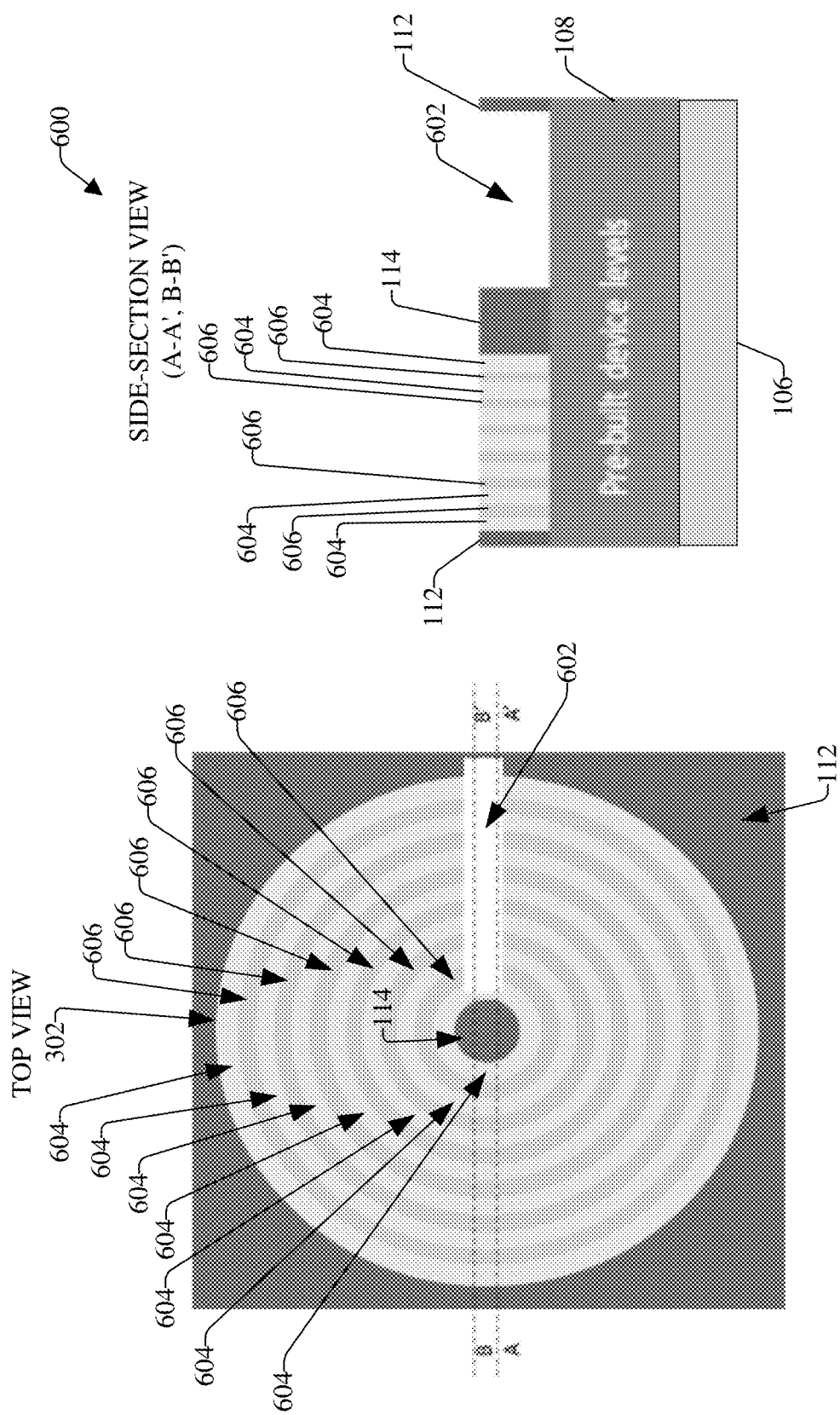
FIG. 6 depicts a diagram of a top view and side-sectional view of an example portion of the electronic device during fabrication, wherein the electronic-device fabrication process can comprise performing a loop cut to form respective concentric segments of respective polymer materials to facilitate generating the electronic device, in accordance with various aspects and embodiments of the disclosed subject matter.

With regard to FIG. 6 (along with FIG. 1 and FIG. 5), FIG. 6 depicts a diagram of a top view and side-sectional view (A-A', B-B' view) of an example portion 600 of the electronic device 104 during fabrication of the electronic device 104, wherein the electronic-device fabrication process can comprise performing a loop cut to form respective concentric segments of respective polymer materials to facilitate generating the electronic device 104, in accordance with various aspects and embodiments of the disclosed subject matter. Repetitive description of like elements employed in other embodiments described herein is or may be omitted for sake of brevity.

In accordance with the electronic-device fabrication process and the example portion 600 of the electronic device 104, the device generator component 102 can perform a loop cut to cut out a portion of the concentric rings (e.g., 502, 504, of FIG. 5) to form loop cut region 602 through a desired portion of the respective concentric rings to form concentric segments (e.g., concentric semi-circular segments) from the concentric rings. For instance, the device generator component 102 can employ a desired cutting, etching, and/or masking technique(s) or process(es) on a desired portion of the respective concentric rings (e.g., 502, 504, of FIG. 5) to perform a loop cut to remove respective desired portions of the respective concentric rings to form the respective concentric segments (e.g., 604, 606) having respective open regions between respective ends (e.g., respective segment ends) of the respective concentric segments, wherein the loop cut region 602 formed by the loop cut can span from at or near the outer end of the low-k dielectric film layer 112 to at or near the center region 114. In the loop cut region 602, the respective polymer materials of the respective concentric rings (e.g., 502, 504, of FIG. 5) can be removed down to or substantially down to the top surface of the top pre-built device level 108. The respective concentric segments (e.g., 604, 606) can comprise a first subset (e.g., type) of concentric segments comprising concentric segments 604 of the first polymer material and a second subset (e.g., type) of concentric segments comprising concentric segments 606 of the second polymer material.

Figure 7:
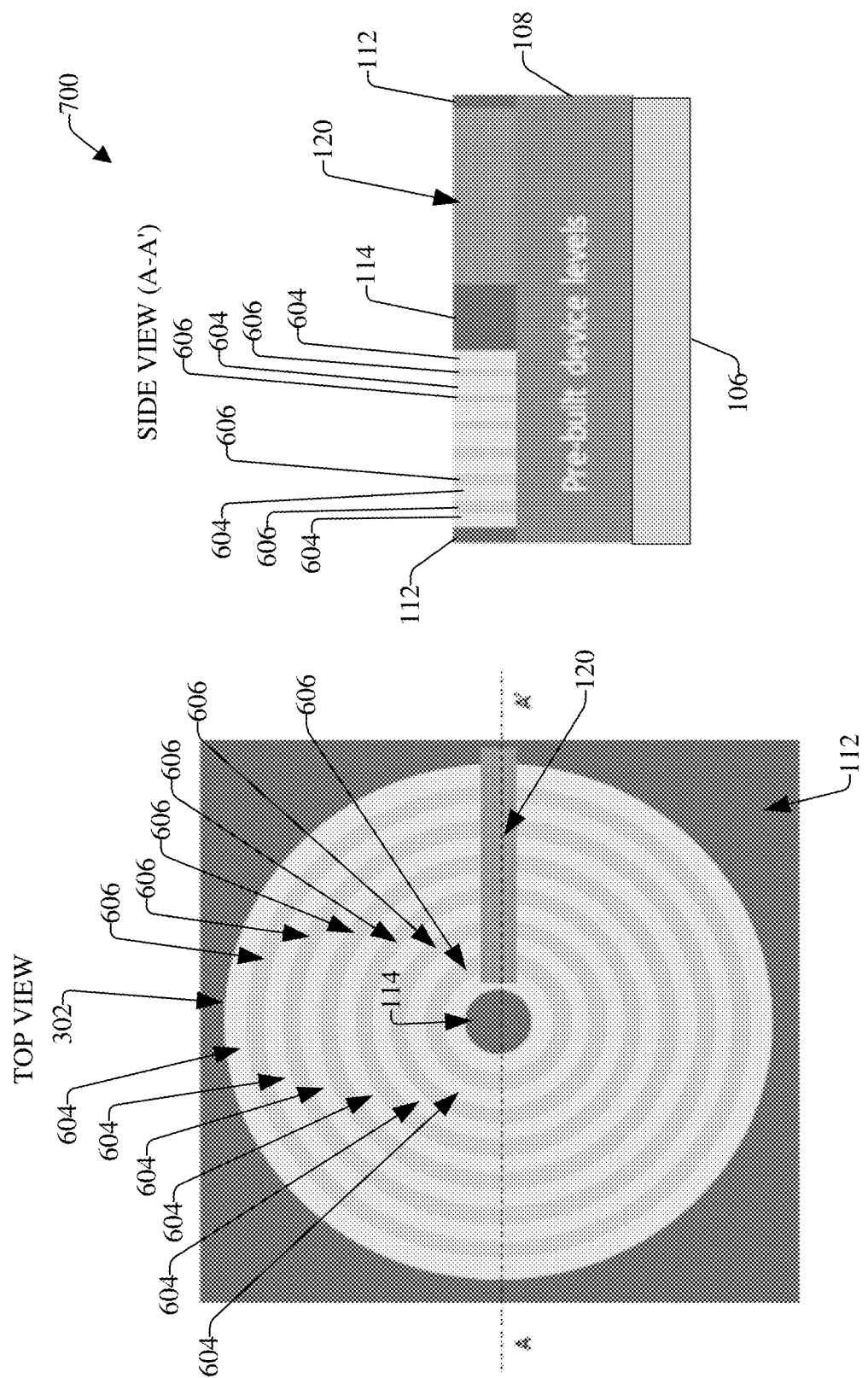
FIG. 7 presents a diagram of a top view and side-sectional view of an example portion of the electronic device during fabrication, wherein the electronic-device fabrication process can comprise filling in the loop cut region with a desired insulator material to facilitate generating the electronic device, in accordance with various aspects and embodiments of the disclosed subject matter.

Referring to FIG. 7 (along with FIG. 1 and FIG. 6), FIG. 7 presents a diagram of a top view and side-sectional view (A-A' view) of an example portion 700 of the electronic device 104 during fabrication of the electronic device 104, wherein the electronic-device fabrication process can comprise filling in the loop cut region with a desired insulator material to facilitate generating the electronic device 104, in accordance with various aspects and embodiments of the disclosed subject matter. Repetitive description of like elements employed in other embodiments described herein is or may be omitted for sake of brevity.

In accordance with the electronic-device fabrication process and the example portion 700 of the electronic device 104, the device generator component 102 can fill in the loop cut region (e.g., 602 of FIG. 6) with a desired insulator material 120 (e.g., an oxide-based insulator material) using a desired deposition or fill technique or process. The desired insulator material 120 can be or can comprise, for example, silicon oxide, silicon oxynitride, carbon-doped silicon oxide, another desired oxide-based material, or another type of insulator material. After the deposition of the desired insulator material 120 in the loop cut region 602, the insulator material 120 can be situated at (e.g., in between) the respective ends of the respective concentric segments (e.g., 604, 606).

In some embodiments, the device generator component 102 can perform a desired planarization process, such as CMP or another suitable planarization process, to planarize or polish at least the surface(s) (top-facing surface(s)) of the insulator material 120 in the loop cut region 602. In certain embodiments, during such planarization process, the device generator component 102 also can perform the desired planarization process on the first polymer material of the concentric segments 604 of the first subset of concentric segments, the second polymer material of the concentric segments 606 of the second subset of concentric segments, the center region 114, and/or the portion of the low-k dielectric film layer 112 forming the outer end of the circular guide pattern 302.

Figure 8:
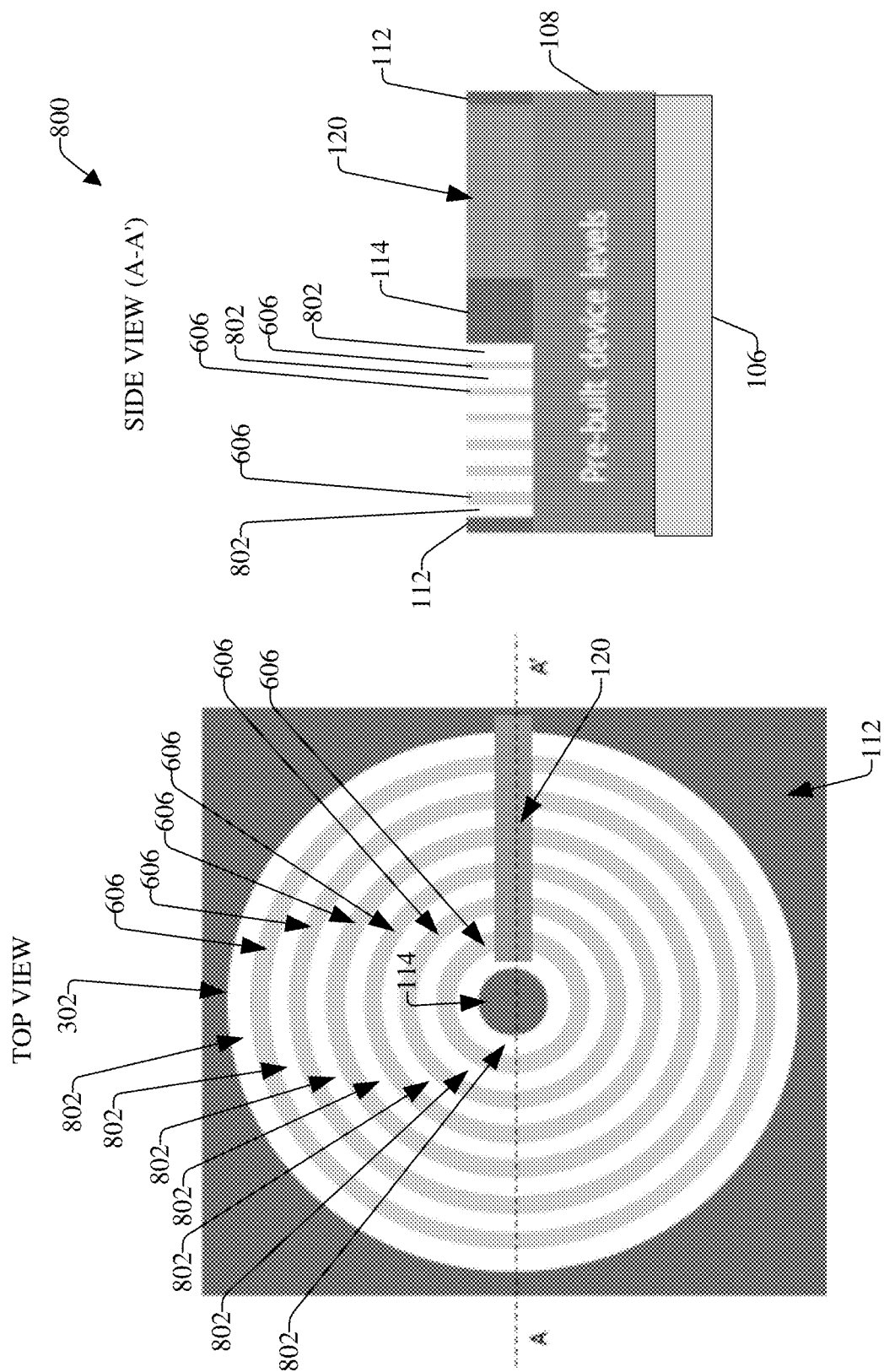
FIG. 8 illustrates a diagram of a top view and side-sectional view of an example portion of the electronic device during fabrication, wherein the electronic-device fabrication process can comprise selectively removing the first polymer, in accordance with various aspects and embodiments of the disclosed subject matter.

Turning briefly to FIG. 8 (along with FIG. 1 and FIG. 7), FIG. 8 illustrates a diagram of a top view and side-sectional view (A-A' view) of an example portion 800 of the electronic device 104 during fabrication of the electronic device 104, wherein the electronic-device fabrication process can comprise selectively removing the first polymer, in accordance with various aspects and embodiments of the disclosed subject matter. Repetitive description of like elements employed in other embodiments described herein is or may be omitted for sake of brevity.

In accordance with the electronic-device fabrication process and the example portion 800 of the electronic device 104, the device generator component 102 can selectively remove the first polymer material from the concentric segments (e.g., first type concentric segments 604) that contain the first polymer to form respective spaces 802 between the respective concentric segments (e.g., second type concentric segments 606) formed of the second polymer. In some embodiments, the device generator component 102 can employ a desired material removal process, such as, for example, reactive ion etching using oxygen-based plasma or other suitable material removal process, to selectively remove the first polymer from the concentric segments (e.g., 604) that contain the first polymer to form the respective spaces 802 between the respective concentric segments (e.g., 606) formed of the second polymer.

Figure 9:
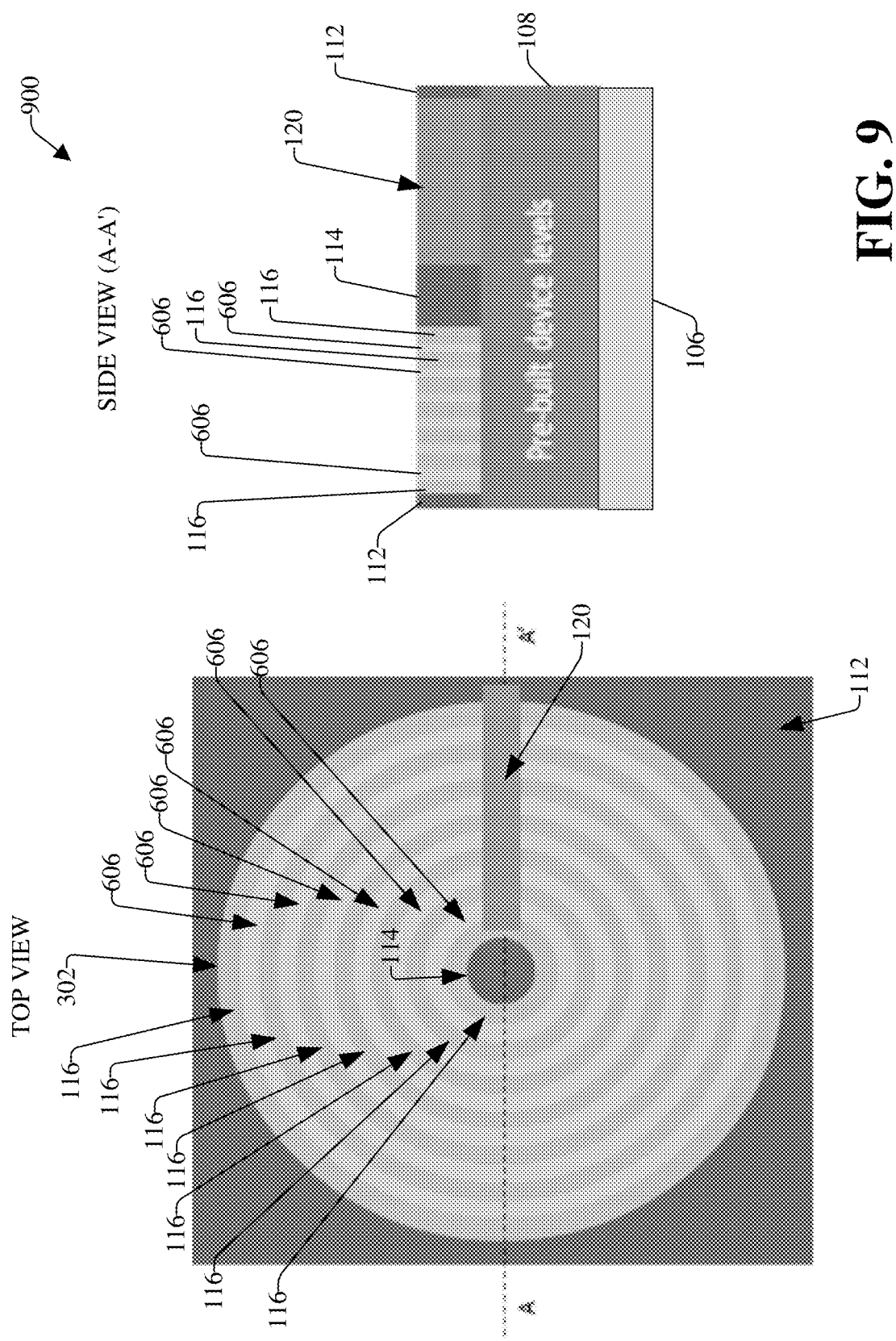
FIG. 9 depicts a diagram of a top view and side-sectional view of an example portion of the electronic device during fabrication, wherein the electronic-device fabrication process can comprise filling the spaces created by the selective removal of the first polymer and performing planarization, in accordance with various aspects and embodiments of the disclosed subject matter.

Referring to FIG. 9 (along with FIG. 1 and FIG. 8), FIG. 9 depicts a diagram of a top view and side-sectional view (A-A' view) of an example portion 900 of the electronic device 104 during fabrication, wherein the electronic-device fabrication process can comprise filling the spaces created by the selective removal of the first polymer and performing planarization, in accordance with various aspects and embodiments of the disclosed subject matter. Repetitive description of like elements employed in other embodiments described herein is or may be omitted for sake of brevity.

In accordance with the electronic-device fabrication process and the example portion 900 of the electronic device 104, the device generator component 102 can deposit a desired insulator material, such as, for example, a desired low-k dielectric material, in the spaces that can be created by the removal (e.g., selective removal) of the first polymer material from the concentric segments (e.g., 604) of the first subset of concentric segments to form concentric segments 116 comprising the desired insulator material. The device generator component 102 can employ a desired deposition or filling technique to deposit the desired insulator material in the spaces created by the removal of the first polymer material from the concentric segments (e.g., 604) to form the concentric segments 116 comprising the desired insulator material.

In some embodiments, the device generator component 102 can perform a desired planarization process, such as CMP or another suitable planarization process, to planarize or polish at least the surface (top-facing surface) of the insulator material (e.g., low-k dielectric material) of the concentric segments 116. In certain embodiments, during such planarization process, the device generator component 102 also can perform the desired planarization process to planarize or polish the second polymer material of the concentric segments 606 of the second subset of concentric segments, the center region 114, and/or the portion of the low-k dielectric film layer 112 forming the outer end of the circular guide pattern 302.

Figure 10:
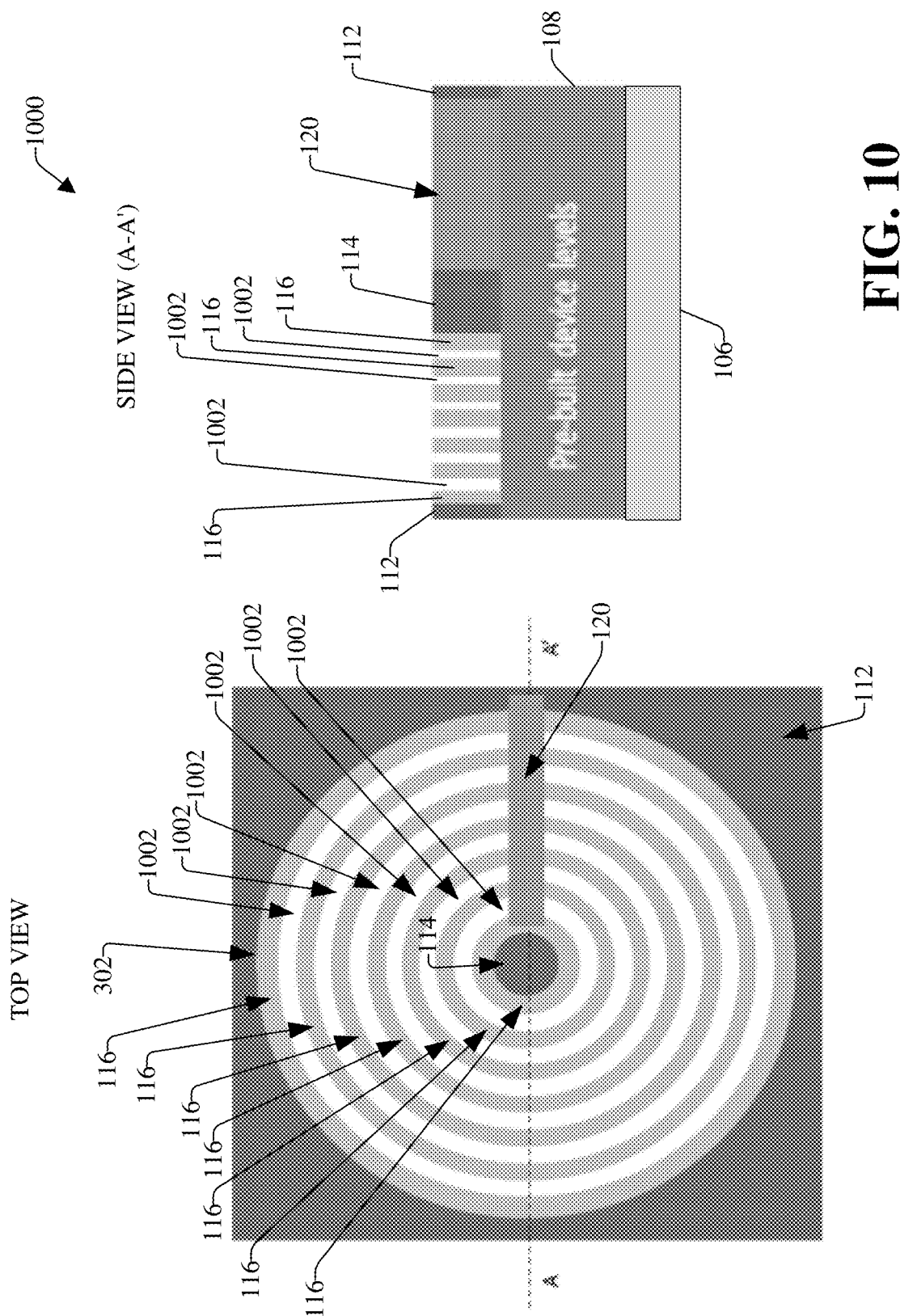
FIG. 10 presents a diagram of a top view and side-sectional view of an example portion of the electronic device during fabrication, wherein the electronic-device fabrication process can comprise selectively removing the second polymer, in accordance with various aspects and embodiments of the disclosed subject matter.

Turning briefly to FIG. 10 (along with FIG. 1 and FIG. 9), FIG. 10 presents a diagram of a top view and side-sectional view (A-A' view) of an example portion 1000 of the electronic device 104 during fabrication, wherein the electronic-device fabrication process can comprise selectively removing the second polymer, in accordance with various aspects and embodiments of the disclosed subject matter. Repetitive description of like elements employed in other embodiments described herein is or may be omitted for sake of brevity.

In accordance with the electronic-device fabrication process and the example portion 1000 of the electronic device 104, the device generator component 102 can selectively remove the second polymer material from the concentric segments (e.g., second type concentric segments 606) that contain the second polymer to form respective spaces 1002 between the respective concentric segments (e.g., concentric segments 116) comprising the desired insulator material. In some embodiments, the device generator component 102 can employ a desired material removal process, such as reactive ion etching using oxygen-based plasma or other suitable material removal process, to selectively remove the second polymer from the concentric segments (e.g., 606) that contain the second polymer to form the respective spaces 1002 between the respective concentric segments (e.g., 116) that include the desired insulator material. During a material removal process (e.g., with regard to a first polymer material and second polymer material, a process to selectively remove the first polymer material; with regard to the second polymer material and a dielectric material, a process to selectively remove the second polymer material), employing an $O_2$-plasma, for example, can achieve approximately a two-to-one first polymer material-to-second polymer material selectivity with respect to removal of the first polymer material, whereas the material removal process can achieve a significantly higher selectivity (e.g., significantly higher than two-to-one selectivity) of a polymer material to a dielectric material with respect to removal of the polymer material.

Figure 11:
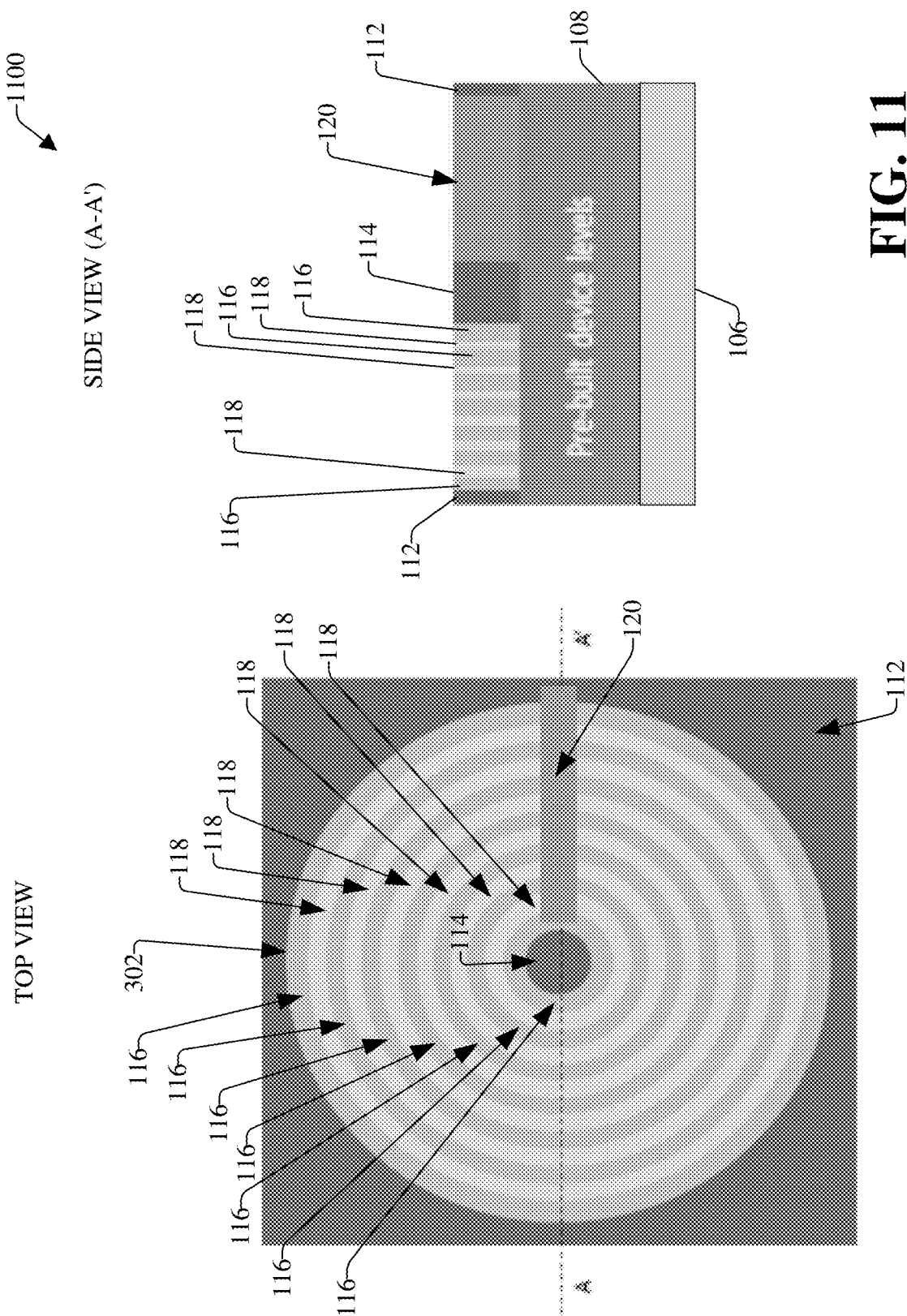
FIG. 11 illustrates a diagram of a top view and side-sectional view of an example portion of the electronic device during fabrication, wherein the electronic-device fabrication process can comprise filling the spaces created by the selective removal of the second polymer and performing planarization, in accordance with various aspects and embodiments of the disclosed subject matter.

With regard to FIG. 11 (along with FIG. 1 and FIG. 10), FIG. 11 illustrates a diagram of a top view and side-sectional view (A-A' view) of an example portion 1100 of the electronic device 104 during fabrication, wherein the electronic-device fabrication process can comprise filling the spaces created by the selective removal of the second polymer and performing planarization, in accordance with various aspects and embodiments of the disclosed subject matter. Repetitive description of like elements employed in other embodiments described herein is or may be omitted for sake of brevity.

In accordance with the electronic-device fabrication process and the example portion 1100 of the electronic device 104, the device generator component 102 can deposit a desired conductive material in the spaces that can be created by the removal (e.g., selective removal) of the second polymer material from the concentric segments (e.g., 606) of the second subset of concentric segments to form concentric segments 118 comprising the desired conductive material. The device generator component 102 can employ a desired deposition or filling technique to deposit the desired conductive material in the spaces created by the removal of the second polymer material from the concentric segments (e.g., 606) to form the concentric segments 118 comprising the desired conductive material.

In some embodiments, the device generator component 102 can perform a desired planarization process, such as CMP or another suitable planarization process, to planarize or polish at least the surfaces (e.g., top-facing surfaces) of the conductive material of the concentric segments 118. In certain embodiments, during such planarization process, the device generator component 102 also can perform the desired planarization process to planarize or polish the insulator material of the concentric segments 116, the center region 114, and/or the portion of the low-k dielectric film layer 112 forming the outer end or frame of the circular guide pattern 302.

Figure 12:
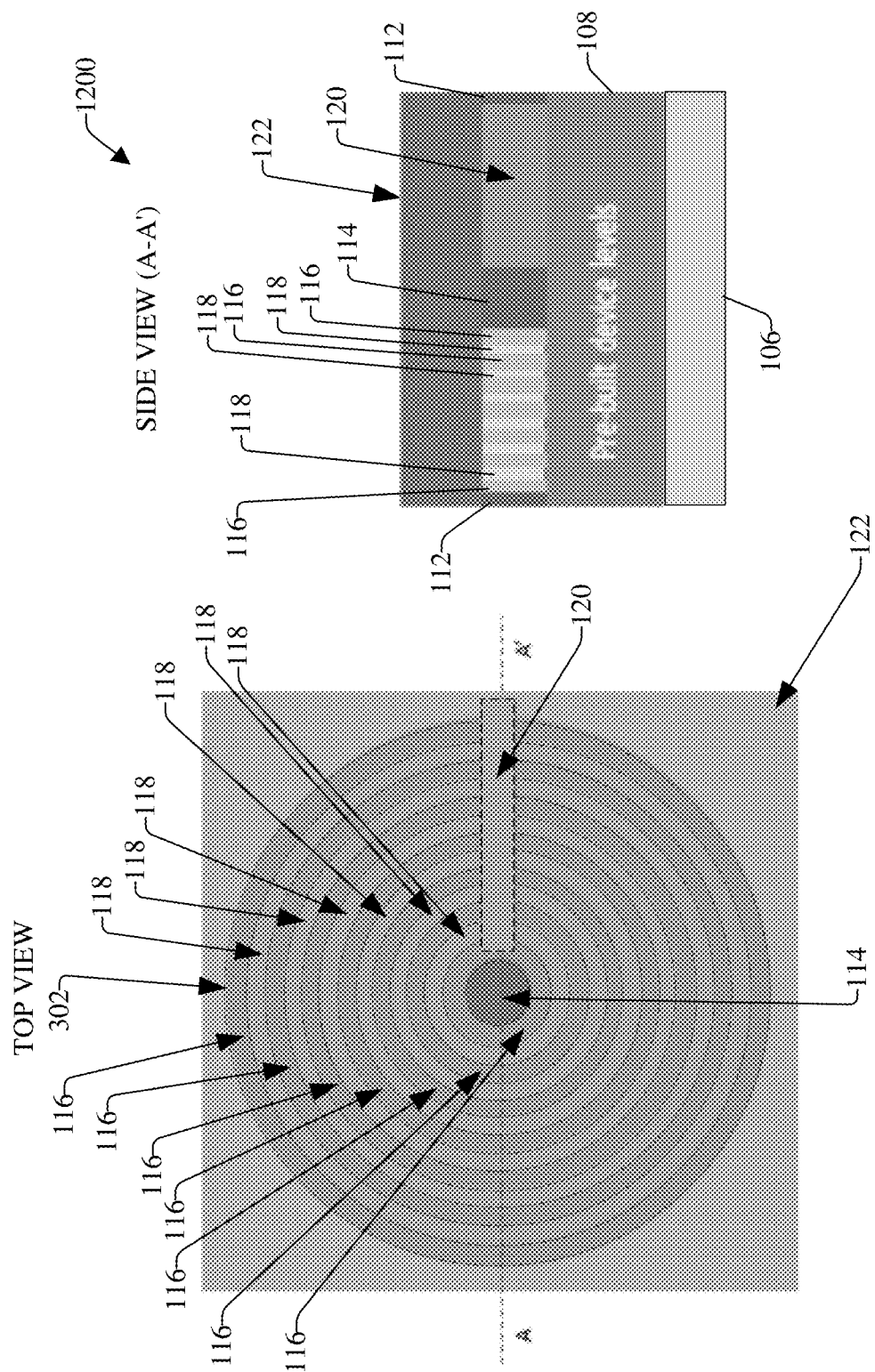
FIG. 12 depicts a diagram of a top view and side-sectional view of an example portion of the electronic device during fabrication, wherein the electronic-device fabrication process can comprise depositing a desired insulator film (e.g., a low-k dielectric film) on the respective concentric segments and/or other portions of the electronic device, in accordance with various aspects and embodiments of the disclosed subject matter.

Turning to FIG. 12 (along with FIG. 1 and FIG. 11), FIG. 12 depicts a diagram of a top view and side-sectional view (A-A' view) of an example portion 1200 of the electronic device 104 during fabrication, wherein the electronic-device fabrication process can comprise depositing a desired insulator film (e.g., a low-k dielectric film) on the respective concentric segments and/or other portions of the electronic device 104, in accordance with various aspects and embodiments of the disclosed subject matter. Repetitive description of like elements employed in other embodiments described herein is or may be omitted for sake of brevity.

In accordance with the electronic-device fabrication process and the example portion 1200 of the electronic device 104, the device generator component 102 can deposit a desired dielectric film layer 122, such as a layer of desired low-k dielectric material, on top of the respective concentric segments (e.g., concentric segments 118 comprising the conductive material, and concentric segments 116 comprising desired insulator material (e.g., a desired low-k dielectric material)), the insulator material that was utilized to fill in the loop cut region, the low-k dielectric material of the center region 114, and/or the portion of the low-k dielectric film layer 112 that forms the outer boundary of the circular guide pattern 302. The dielectric film layer 122 can have a desired thickness, wherein the thickness can range from 50 nm to 500 nm, for example.

Referring again to FIG. 2 (along with FIG. 1), the device generator component 102 can form, cut, or etch vias in the dielectric film layer 122, wherein each via can span from an end of one concentric segment 118 (e.g., concentric segment formed of conductive material) across the insulator material 120 of the loop cut region to an end of another concentric segment 118 (e.g., concentric segment formed of conductive material). The device generator component 102 can fill the vias with conductive material to form conductive connectors 124 (e.g., conductive vias) to facilitate forming the enhanced spiral structure 110 (e.g., a spiral or substantially spiral conductive structure). To form the conductive connectors 124, the vias can be filled with a desired conductive material (e.g., a metal) including, but not limited to, copper, indium-tin oxide, indium-zinc oxide, aluminum-zinc oxide, titanium, aluminum molybdenum, cobalt, silver, gold, nickel, tungsten, chromium, hafnium, platinum, iron, and/or any of their conductive alloys.

The device generator component 102 can planarize respective surfaces (e.g., respective top or open facing surfaces) of the conductive connectors 124 and/or the dielectric film layer 122 of the electronic device 104. In some embodiments, the device generator component 102 can perform CMP on the respective surfaces of the conductive connectors 124 and/or dielectric film layer 122. In other embodiments, the device generator component 102 can employ another type (e.g., a suitable type) of planarization process to planarize or polish the respective surfaces of the dielectric film layer 122 and conductive connectors 124 of the electronic device 104.

Figure 13:
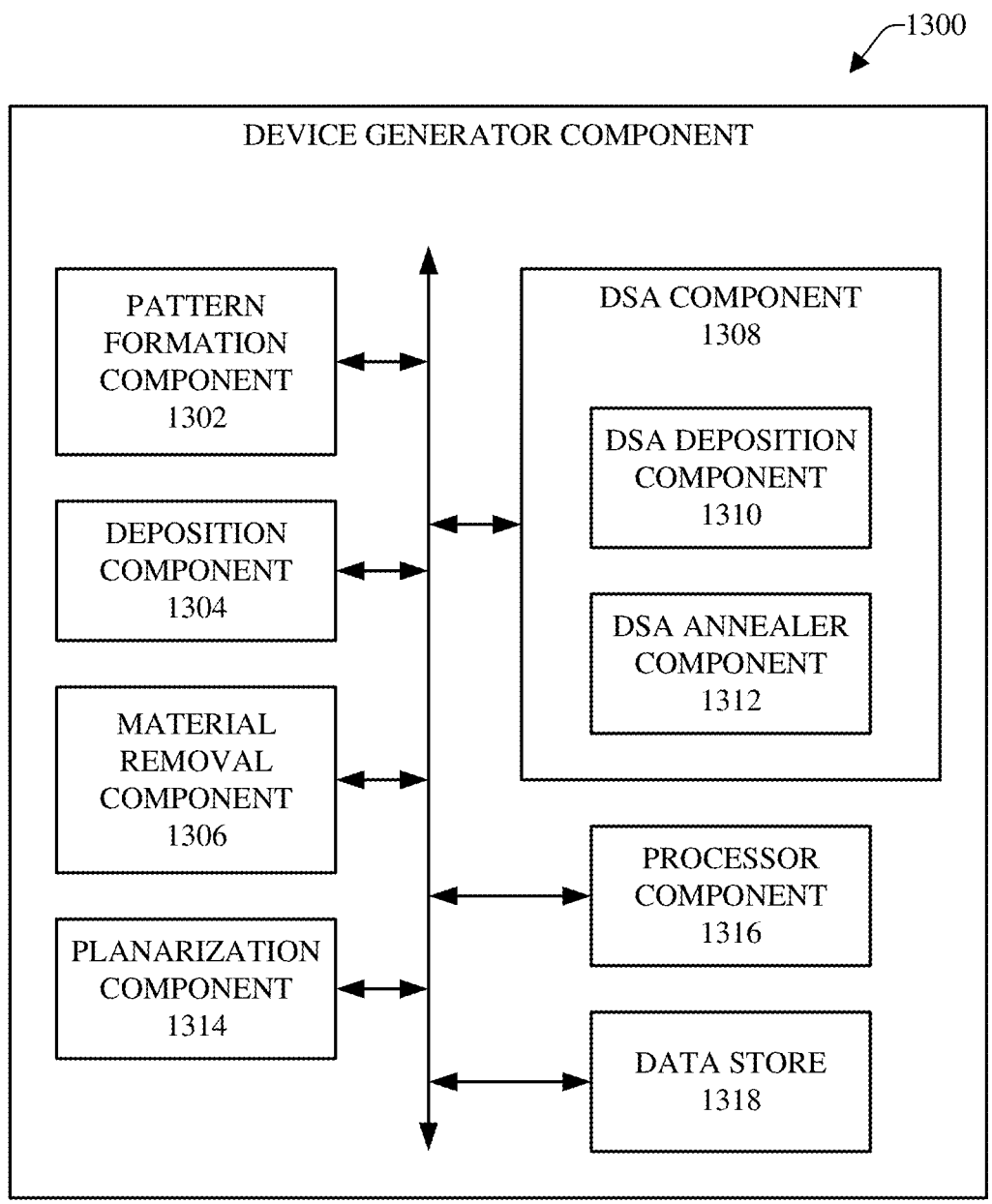
FIG. 13 illustrates a block diagram of an example device generator component, in accordance with various aspects and embodiments of the disclosed subject matter.

FIG. 13 illustrates a block diagram of an example device generator component 1300, in accordance with various aspects and embodiments of the disclosed subject matter. The device generator component 1300 can comprise, for example, a pattern formation component 1302, deposition component 1304, a material removal component 1306, a DSA component 1308, which can include a DSA deposition component 1310 and DSA annealer component 1312, a planarization component 1314, a processor component 1316, and a data store 1318.

The pattern formation component 1302 can be employed to form or create a desired guide pattern, such as, for example, a circular guide pattern to facilitate creating the enhanced spiral structure. The pattern formation component 1302 can operate in conjunction with the deposition component 1304 to deposit a desired insulator material, such as a low-k dielectric film, on a pre-built device level. In some embodiments, the pattern formation component 1302 can operate in conjunction with the material removal component 1306 to remove a portion of such insulator material to form the circular guide pattern.

The DSA component 1308 can be employed to perform various DSA and DSA-related processes to facilitate creating an electronic device, including an enhanced spiral structure of the electronic device. The DSA component 1308 can be employed to create a desired co-polymer material that can be utilized in the DSA processes to facilitate creating the enhanced spiral structure. The DSA deposition component 1310 can be employed to deposit the co-polymer material in the bounded space of the circular guide pattern. The DSA annealer component 1312 can perform DSA annealing on the co-polymer material to form respective concentric rings, comprising first concentric rings of a first polymer material and second concentric rings of a second polymer material.

At various appropriate times during the device generation process, the material removal component 1306 can be employed to remove materials in connection with formation of the enhanced spiral structure and the electronic device. For instance, the material removal component 1306 can be utilized to perform a loop cut to remove respective portions of the first and second polymers to create a loop cut region that can span across a portion of the concentric rings to transform the concentric rings into concentric segments. The material removal component 1306 also can be utilized to selectively remove the first polymer material and the second polymer material at respective appropriate times during the device generation process. The material removal component 1306 further can remove portions of material in a low-k dielectric film to form vias (e.g., channels) in the low-k dielectric film to facilitate creating conductive connectors in the vias, as more fully described herein. The material removal component 1306 can perform various types of material removal processes, as appropriate, to perform the desired removal of material, wherein the various types of material removal processes can comprise, for example, etching material to remove a desired portion of a material, cutting material to remove a desired portion of a material, stripping material to remove a desired portion of a material, or another desired material removal process.

At various appropriate times during the device generation process, the deposition component 1304 can deposit various materials to facilitate forming the enhanced spiral structure and associated electronic device. For example, the deposition component 1304 can deposit a desired insulator material in the loop cut region, deposit a desired insulator material (e.g., a low-k dielectric material) in the spaces of the first concentric segments that were formed by the removal of the first polymer from the first concentric segments by the material removal component 1306, deposit a desired conductive material (e.g., copper, copper-based material) in the spaces of the second concentric segments that were formed by the removal of the second polymer from the second concentric segments by the material removal component 1306, deposit a low-k dielectric film on the first concentric segments, comprising the insulator material, and second concentric segments, comprising the conductive material, and the insulator material in the loop cut region, and/or deposit conductive material in the vias formed in the low-k dielectric film to form the conductive connectors, as more fully described herein.

At various appropriate times during the device generation process, the planarization component 1314 can be employed to planarize or polish surfaces of materials (e.g., surfaces of insulator materials, surfaces of conductive materials) to create a desirably smooth or polished surface. The planarization component 1314 can perform CMP or another desired (e.g., suitable, optimal) planarization process to planarize or polish the surfaces of materials.

The processor component 1316 can work in conjunction with the other components (e.g., pattern formation component 1302, deposition component 1304, material removal component 1306, DSA component 1308, planarization component 1314, data store 1318) to facilitate performing the various functions of the device generator component 1300. The processor component 1316 can employ one or more processors, microprocessors, or controllers that can process data, such as information relating to pattern formation, DSA processes, material deposition, material removal, planarization processes, parameters relating to creation of an enhanced spiral structure or other components of an electronic device, polymer materials, insulator materials, conductive materials, traffic flows, policies, algorithms (e.g., DSA algorithm(s), deposition algorithm(s), planarization algorithm(s), . . . ), protocols, interfaces, tools, and/or other information, to facilitate operation of the device generator component 1300, as more fully disclosed herein, and control data flow between the device generator component 1300 and other components (e.g., computer, network devices of the communication network, data sources, applications, . . . ) associated with the device generator component 1300.

The data store 1318 can store data structures (e.g., user data, metadata), code structure(s) (e.g., modules, objects, hashes, classes, procedures) or instructions, information relating to pattern formation, DSA processes, material deposition, material removal, planarization processes, parameters relating to creation of an enhanced spiral structure or other components of an electronic device, polymer materials, insulator materials, conductive materials, traffic flows, policies, algorithms (e.g., DSA algorithm(s), deposition algorithm(s), planarization algorithm(s), . . . ), protocols, interfaces, tools, and/or other information, to facilitate controlling operations associated with the device generator component 1300. In an aspect, the processor component 1316 can be functionally coupled (e.g., through a memory bus) to the data store 1318 in order to store and retrieve information desired to operate and/or confer functionality, at least in part, to the pattern formation component 1302, deposition component 1304, material removal component 1306, DSA component 1308, planarization component 1314, etc., and/or substantially any other operational aspects of the device generator component 1300.

Figure 14:
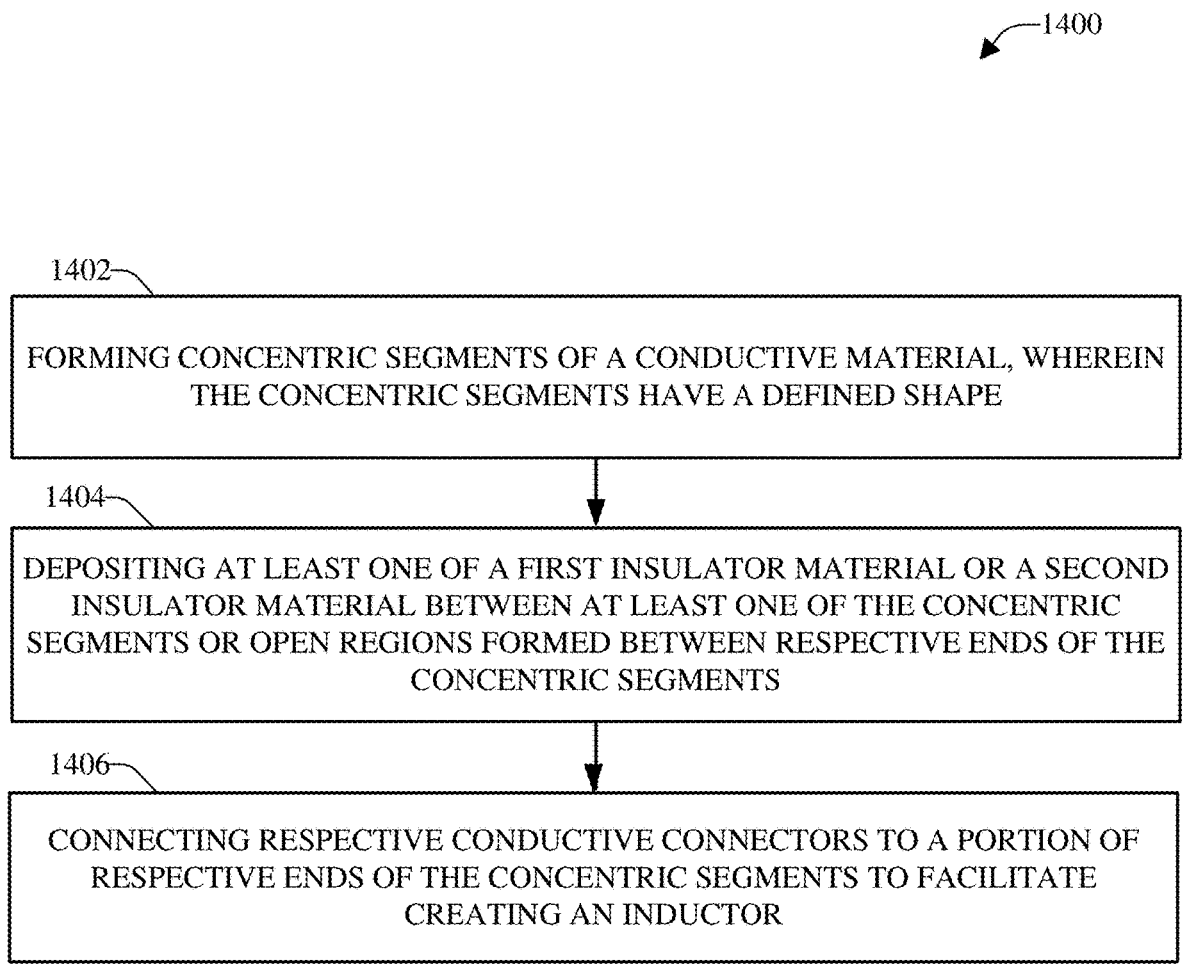
FIG. 14 illustrates a flow diagram of an example, non-limiting method for fabricating an electronic device comprising an enhanced spiral structure, in accordance with various aspects and embodiments of the disclosed subject matter.

FIG. 14 illustrates a flow diagram of an example, non-limiting method 1400 for fabricating an electronic device comprising an enhanced spiral structure, in accordance with various aspects and embodiments of the disclosed subject matter. In some embodiments, the electronic device can be an inductor comprising an enhanced spiral structure (e.g., enhanced spiral or substantially spiral structure). In other embodiments, the electronic device can be another type of device having certain functionality and comprising an enhanced spiral structure. The method 1400 can be performed by, for example, the device generator component. Repetitive description of like elements employed in other embodiments described herein is or may be omitted for sake of brevity.

At 1402, concentric segments of a conductive material can be formed, wherein the concentric segments have a defined shape. The device generator component can form the concentric segments of the conductive material.

At 1404, at least one of a first insulator material or a second insulator material can be deposited between at least one of the concentric segments or open regions formed between respective ends of the concentric segments. In accordance with the method 1400, at appropriate points in the device generation process, the device generator component can deposit at least one of the first insulator material or the second insulator material between at least one of the concentric segments or open regions formed between respective ends of the concentric segments. For example, after removing or stripping the first polymer from a first subset of concentric segments, the device generator component can deposit the first insulator material (e.g., a low-k dielectric material) in spaces, which can be formed from the removal of the first polymer material, wherein such spaces can be located between the concentric segments comprising the conductive material. In accordance with various embodiments, the depositing of the first insulator material in such spaces can be performed before the conductive material is deposited in the concentric segments formed of the conductive material, or alternatively, the depositing of the conductive material in the locations where the conductive material is deposited (e.g., locations from which the second polymer material has been removed) can be performed before the insulator material is deposited in such spaces formed by removing the first polymer material, as more fully described herein.

At 1406, respective conductive connectors can be connected to a portion of respective ends of the concentric segments to facilitate creating an inductor. The device generator component can connect the respective conductive connectors to the portion of the respective ends of the concentric segments to facilitate creating an inductor. For example, the device generator component can form the conductive connectors and can connect, for each pair of adjacent or proximately located conductive concentric segments (e.g., concentric segments, comprising conductive material, that are associated with (e.g., located at respective sides of) the same concentric segment comprising insulator material), the end of one conductive concentric segment to the end of the other conductive concentric segment, using a conductive connector, to form the enhanced spiral structure of the electronic device. It is to be appreciated and understood that, during fabrication of the electronic device, other processes, such as particular DSA processes, material removal processes, planarization of surfaces, etc., can be performed, as more fully described herein.

Figure 15A:
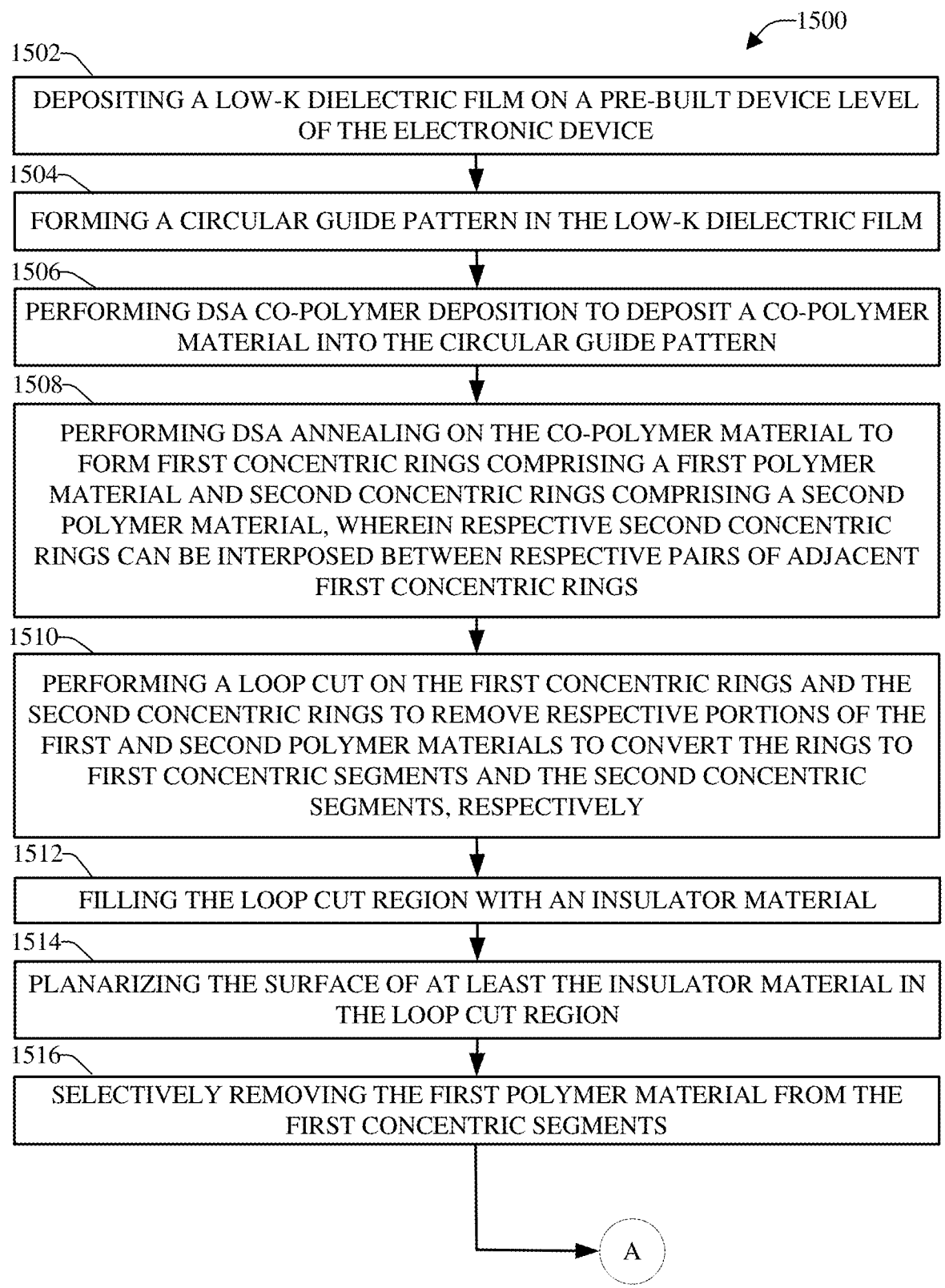
FIGS. 15A and 15B depict a flow diagram of another example, non-limiting method for fabricating an electronic device comprising an enhanced spiral structure, in accordance with various aspects and embodiments of the disclosed subject matter.
Figure 15B:
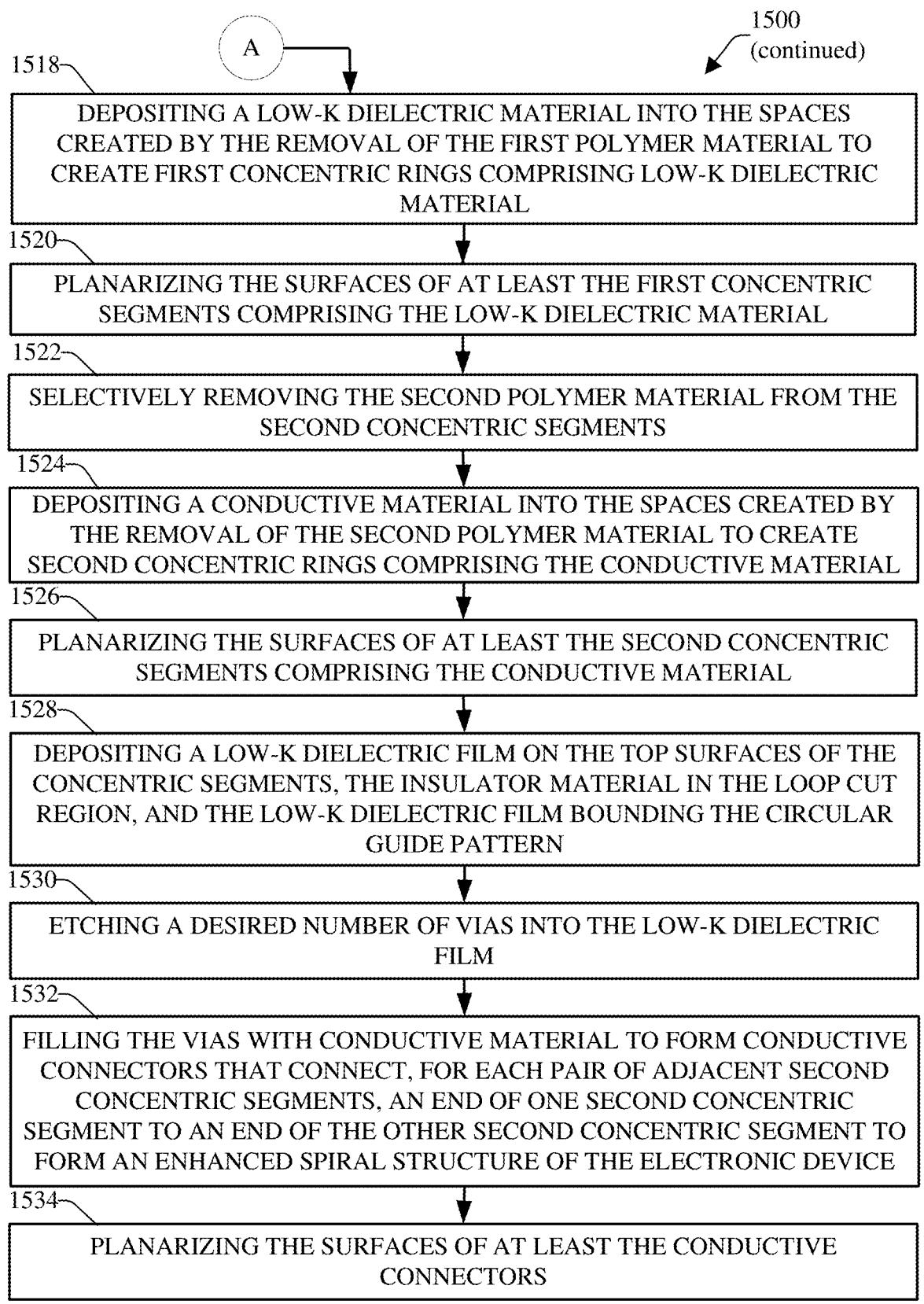

FIGS. 15A and 15B depict a flow diagram of another example, non-limiting method 1500 for fabricating an electronic device comprising an enhanced spiral structure, in accordance with various aspects and embodiments of the disclosed subject matter. In some embodiments, the electronic device can be an inductor comprising an enhanced spiral structure (e.g., enhanced spiral or substantially spiral structure). In other embodiments, the electronic device can be another type of device having certain functionality and comprising an enhanced spiral structure. The method 1500 can be performed by, for example, the device generator component. Repetitive description of like elements employed in other embodiments described herein is or may be omitted for sake of brevity.

At 1502, a low-k dielectric film can be deposited on a pre-built device level of the electronic device. The device generator component can deposit the low-k dielectric film on the pre-built device level (e.g., the top surface of the top pre-built device level) of the electronic device.

At 1504, a circular guide pattern can be formed in the low-k dielectric film. The device generator component can form the circular guide pattern in the low-k dielectric film by selectively removing a portion of the low-k dielectric film from the surface of the pre-built device level or selectively applying the low-k dielectric film to the surface of the pre-built device level to form the circular guide pattern. The circular guide pattern can comprise a center region, comprising low-k dielectric film, in the center or substantially in the center of the circular guide pattern and an outer region, comprising low-k dielectric film, that frames or bounds the outer end (e.g., outer edge) of the circular guide pattern. The circular guide pattern can have a desired size (e.g., diameter, radius, circumference)

At 1506, DSA co-polymer deposition can be performed to deposit a co-polymer material into the circular guide pattern. The device generator component can perform the DSA co-polymer deposition to deposit the co-polymer material into the space of the circular guide pattern that is defined or bounded by the low-k dielectric material.

At 1508, DSA annealing can be performed on the co-polymer material to form first concentric rings comprising a first polymer material and second concentric rings comprising a second polymer material, wherein respective second concentric rings can be interposed between respective pairs of adjacent first concentric rings. The device generator component can perform the DSA annealing on the co-polymer material to form the first concentric rings and the second concentric rings.

At 1510, a loop cut can be performed on the first concentric rings and the second concentric rings to remove respective portions of the first and second polymer materials to convert the rings to first concentric segments and the second concentric segments, respectively. The device generator component can perform the loop cut to remove respective portions of the first and second polymer materials to form a loop cut region and convert the rings to first concentric segments and the second concentric segments, respectively.

At 1512, the loop cut region can be filled with an insulator material. The device generator component can fill the loop cut region to the insulator material. The insulator material can comprise, for example, an oxide-based insulator material.

At 1514, the surface of at least the insulator material in the loop cut region can be planarized. The device generator component can planarize or polish the surface (e.g., top surface) of at least insulator material in the loop cut region. In some embodiments, the device generator component also can planarize the first concentric segments, second concentric segments, and/or low-k dielectric film that bounds the circular guide pattern as well. In certain embodiments, the planarization can be CMP.

At 1516, the first polymer material can be selectively removed from the first concentric segments. The device generator component can selectively remove the first polymer material from the first concentric segments using a desired polymer material removal process, such as disclosed herein. At this point, the method 1500 can proceed to reference point A, wherein, in FIG. 15B, the method 1500 can continue from reference point A to reference numeral 1518, and the method 1500 can proceed from that point.

At 1518, a low-k dielectric material can be deposited into the spaces created by the removal of the first polymer material to create first concentric rings comprising low-k dielectric material. The device generator component can deposit the low-k dielectric material into the spaces created by the removal of the first polymer material to fill such spaces and create the first concentric rings comprising the low-k dielectric material.

At 1520, the surfaces of at least the first concentric segments comprising the low-k dielectric material can be planarized. The device generator component can planarize or polish the surfaces (e.g., top surfaces) of at least the first concentric segments comprising the low-k dielectric material. In certain embodiments, the device generator component also can planarize or polish the second concentric segments comprising the second polymer, the insulator material in the loop cut region, and/or the low-k dielectric film that bounds the circular guide pattern. In some embodiments, the planarization can be CMP.

At 1522, the second polymer material can be selectively removed from the second concentric segments. The device generator component can selectively remove the second polymer material from the second concentric segments using a desired polymer material removal process, such as disclosed herein.

At 1524, a conductive material can be deposited into the spaces created by the removal of the second polymer material to create second concentric rings comprising the conductive material. The device generator component can deposit the conductive material into the spaces created by the removal of the second polymer material to fill such spaces and create the second concentric rings comprising the conductive material.

At 1526, the surfaces of at least the second concentric segments comprising the conductive material can be planarized. The device generator component can planarize or polish the surfaces (e.g., top surfaces) of at least the second concentric segments comprising the conductive material. In some embodiments, the device generator component also can planarize or polish the first concentric segments comprising the low-k dielectric material, the insulator material in the loop cut region, and/or the low-k dielectric film that bounds the circular guide pattern. In certain embodiments, the planarization can be CMP.

At 1528, a low-k dielectric film can be deposited on the top surfaces of the first concentric segments, the second concentric segments, the insulator material in the loop cut region, and the low-k dielectric film that bounds the circular guide pattern. The device generator component can deposit the low-k dielectric film can be deposited on those top surfaces of the first concentric segments, the second concentric segments, the insulator material in the loop cut region, and the low-k dielectric film that bounds the circular guide pattern.

At 1530, a desired number of vias can be etched into the low-k dielectric film in proximity to the insulator material in the loop cut region. The device generator component can etch or cut the desired number of vias into the low-k dielectric film in proximity to (e.g., in the area of the low-k dielectric film above) the insulator material in the loop cut region. The vias can span over the desired insulator material of the loop cut region between respective ends of the respective second (e.g., conductive) concentric segments. The number of vias formed can be based at least in part on (e.g., can substantially correspond to) the number of second concentric segments comprising the conductive material there are. For example, for x second concentric segments, there can be x−1 vias formed in the low-k dielectric film.

At 1532, the vias can be filled with a conductive material to form conductive connectors that connect, for each pair of adjacent second (e.g., conductive) concentric segments, an end of one second concentric segment to an end of the other second concentric segment to form an enhanced spiral structure of the electronic device. The device generator component can deposit the conductive material in the vias to form the conductive connectors and, as a result, can connect, for each pair of adjacent or proximately located conductive concentric segments, the end of one conductive concentric segment to the end of the other conductive concentric segment, using a conductive connector, to form the enhanced spiral structure of the electronic device. The conductive connectors can span across or over the desired insulator material of the loop cut region to connect the respective ends of the respective conductive concentric segments to each other.

At 1534, the surfaces of at least the conductive connectors can be planarized. The device generator component can planarize or polish the surfaces (e.g., top surfaces) of at least the conductive connectors. In some embodiments, the device generator component also can planarize or polish the first concentric segments comprising the low-k dielectric material, the second concentric segments comprising the conductive material, the insulator material in the loop cut region, and/or the low-k dielectric film that bounds the circular guide pattern. In certain embodiments, the planarization can be CMP.

For simplicity of explanation, the methods and/or computer-implemented methods are depicted and described as a series of acts. It is to be understood and appreciated that the disclosed subject matter is not limited by the acts illustrated and/or by the order of acts, for example acts can occur in various orders and/or concurrently, and with other acts not presented and described herein. Furthermore, not all illustrated acts can be required to implement the computer-implemented methods in accordance with the disclosed subject matter. In addition, those skilled in the art will understand and appreciate that the computer-implemented methods could alternatively be represented as a series of interrelated states via a state diagram or events. Additionally, it should be further appreciated that the computer-implemented methods disclosed hereinafter and throughout this specification are capable of being stored on an article of manufacture to facilitate transporting and transferring such computer-implemented methods to computers. The term article of manufacture, as used herein, is intended to encompass a computer program accessible from any computer-readable device or storage media.

Figure 16:
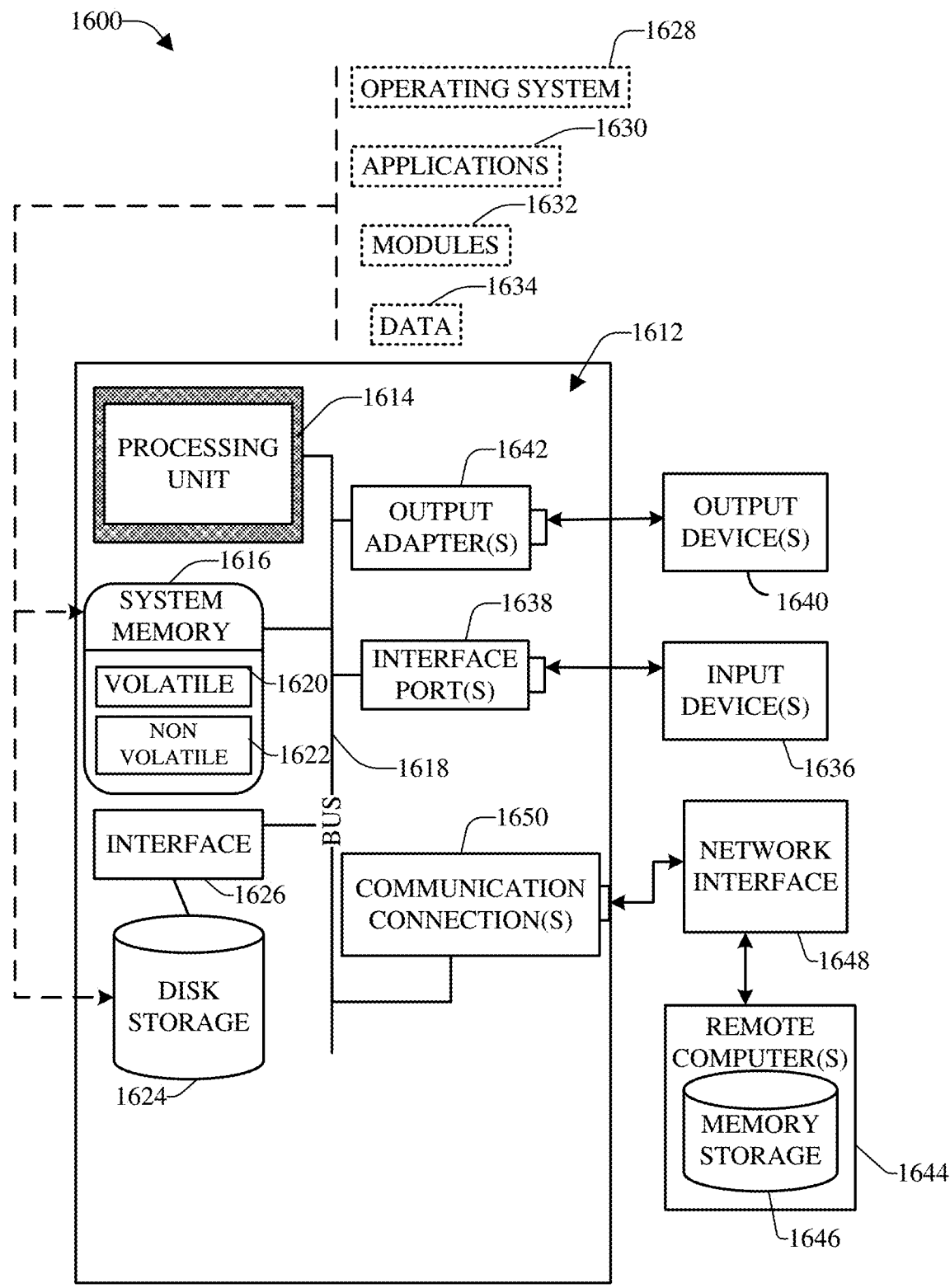
FIG. 16 illustrates a block diagram of an example, non-limiting operating environment in which one or more embodiments described herein can be facilitated.

In order to provide a context for the various aspects of the disclosed subject matter, FIG. 16 as well as the following discussion are intended to provide a general description of a suitable environment in which the various aspects of the disclosed subject matter can be implemented. FIG. 16 illustrates a block diagram of an example, non-limiting operating environment in which one or more embodiments described herein can be facilitated. Repetitive description of like elements employed in other embodiments described herein is omitted for sake of brevity. With reference to FIG. 16, a suitable operating environment 1600 for implementing various aspects of this disclosure can also include a computer 1612. The computer 1612 can also include a processing unit 1614, a system memory 1616, and a system bus 1618. The system bus 1618 couples system components including, but not limited to, the system memory 1616 to the processing unit 1614. The processing unit 1614 can be any of various available processors. Dual microprocessors and other multiprocessor architectures also can be employed as the processing unit 1614. The system bus 1618 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI). The system memory 1616 can also include volatile memory 1620 and nonvolatile memory 1622. The basic input/output system (BIOS), containing the basic routines to transfer information between elements within the computer 1612, such as during start-up, is stored in nonvolatile memory 1622. By way of illustration, and not limitation, nonvolatile memory 1622 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM)). Volatile memory 1620 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 1612 can also include removable/non-removable, volatile/nonvolatile computer storage media. FIG. 16 illustrates, for example, a disk storage 1624. Disk storage 1624 can also include, but is not limited to, devices like a magnetic disk drive, floppy disk drive, tape drive, Jaz drive, Zip drive, LS-100 drive, flash memory card, or memory stick. The disk storage 1624 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1624 to the system bus 1618, a removable or non-removable interface is typically used, such as interface 1626. FIG. 16 also depicts software that acts as an intermediary between users and the basic computer resources described in the suitable operating environment 1600. Such software can also include, for example, an operating system 1628. Operating system 1628, which can be stored on disk storage 1624, acts to control and allocate resources of the computer 1612. System applications 1630 take advantage of the management of resources by operating system 1628 through program modules 1632 and program data 1634, e.g., stored either in system memory 1616 or on disk storage 1624. It is to be appreciated that this disclosure can be implemented with various operating systems or combinations of operating systems. A user enters commands or information into the computer 1612 through input device(s) 1636. Input devices 1636 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1614 through the system bus 1618 via interface port(s) 1638. Interface port(s) 1638 include, for example, a serial port, a parallel port, a game port, and a universal serial bus (USB). Output device(s) 1640 use some of the same type of ports as input device(s) 1636. Thus, for example, a USB port can be used to provide input to computer 1612, and to output information from computer 1612 to an output device 1640. Output adapter 1642 is provided to illustrate that there are some output devices 1640 like monitors, speakers, and printers, among other output devices 1640, which require special adapters. The output adapters 1642 include, by way of illustration and not limitation, video and sound cards that provide a method of connection between the output device 1640 and the system bus 1618. It should be noted that other devices and/or systems of devices provide both input and output capabilities such as remote computer(s) 1644.

Computer 1612 can operate in a networked environment using logical connections to one or more remote computers, such as remote computer(s) 1644. The remote computer(s) 1644 can be a computer, a server, a router, a network PC, a workstation, a microprocessor based appliance, a peer device or other common network node and the like, and typically can also include many or all of the elements described relative to computer 1612. For purposes of brevity, only a memory storage device 1646 is illustrated with remote computer(s) 1644. Remote computer(s) 1644 is logically connected to computer 1612 through a network interface 1648 and then physically connected via communication connection 1650. Network interface 1648 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1650 refers to the hardware/software employed to connect the network interface 1648 to the system bus 1618. While communication connection 1650 is shown for illustrative clarity inside computer 1612, it can also be external to computer 1612. The hardware/software for connection to the network interface 1648 can also include, for exemplary purposes only, internal and external technologies such as, modems including regular telephone grade modems, cable modems and DSL modems, ISDN adapters, and Ethernet cards.

One or more embodiments may be a system, a method, an apparatus and/or a computer program product at any possible technical detail level of integration. The computer program product can include a computer readable storage medium (or media) having computer readable program instructions thereon for causing a processor to carry out aspects of the one or more embodiments. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the disclosed subject matter can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the disclosed subject matter.

Aspects of disclosed subject matter are described herein with reference to flowchart illustrations and/or block diagrams of methods, apparatus (systems), and computer program products according to embodiments of the subject disclosure. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create method for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the disclosed subject matter. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can be implemented in combination with other program modules. Generally, program modules include routines, programs, components, data structures, etc. that perform particular tasks and/or implement particular abstract data types. Moreover, those skilled in the art will appreciate that the computer-implemented methods disclosed herein can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other method to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM)). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
   an inductor formed over a substrate, wherein the inductor comprises:
      first concentric segments formed of a conductive material, having a defined shape and having a defined pitch between ones of the first concentric segments that is less than or equal to a defined value;
      second concentric segments formed of an insulator material in the defined shape, wherein the first concentric segments are interspersed in an alternating fashion between the second concentric segments, and wherein the first concentric segments and the second concentric segments are disposed around a center region;
      a dielectric layer disposed over the first concentric segments, the second concentric segments and the center region;
      open regions between ends of the first concentric segments, wherein the open regions comprise a second insulator material; and
      vias disposed within the dielectric layer and spanning from first ends of the first concentric segments across the open regions to second ends of the first concentric segments, wherein the vias have provided within second conductive material to form conductive connectors of the vias, wherein an amount of inductance of the inductor is based on the defined pitch between the ones of the first concentric segments.

2. The device of claim 1, wherein the defined shape comprises a semi-circular shape.

3. The device of claim 2, wherein the defined pitch is 60 nanometers and the amount of the inductance is 0.34 nanohenries.

4. The device of claim 2, wherein the defined pitch is less than 100 nanometers and the amount of the inductance is greater than 0.16 nanohenries.

5. The device of claim 3, wherein the device has a chip area of approximately 2.5 micrometers by 2.5 micrometers.

6. The device of claim 4, wherein the device has a chip area of approximately 2.5 micrometers by 2.5 micrometers.

7. The device of claim 1, wherein the second conductive material is selected from a group consisting of tungsten, chromium, hafnium, platinum and iron.

8. The device of claim 1, wherein the second conductive material is selected from a group consisting of aluminum-zinc oxide, titanium, aluminum molybdenum and cobalt.

9. The device of claim 1, wherein the defined shape comprises a semi-rectangular shape.

10. The device of claim 1, wherein at least one of the conductive material or the second conductive material comprises copper.

11. The device of claim 1, wherein the second conductive material is selected from a group consisting of indium-tin oxide and indium-zinc oxide.

12. The device of claim 1, wherein the second conductive material is selected from a group consisting of silver, gold, and nickel.

13. The device of claim 1, wherein the second conductive material is comprised of an alloy formed of a conductive element.

14. The device of claim 1, wherein at least one of the insulator material or the second insulator material comprises an oxide-based material.

15. The device of claim 1, wherein the amount of inductance of the inductor is further based on a pattern or a shape of the inductor.

16. A semiconductor chip, comprising:
   first concentric semi-circular segments comprising a conductive material;
   at least one concentric semi-circular segment of insulator material situated between the concentric semi-circular segments comprising the conductive material;
   open regions between ends of the first concentric segments, wherein the open regions comprise a second insulator material; and
   vias disposed within a dielectric layer of the chip and spanning from the ends of the first concentric semi-circular segments across the open regions to second ends of the first concentric semi-circular segments, wherein the vias have provided within second conductive material to form conductive connectors, and wherein an amount of inductance of the inductor is based on a defined pitch between adjacent ones of the first concentric semi-circular segments.

17. The semiconductor chip of claim 16, wherein the conductive material comprises copper, wherein the conductive connectors are selected from a group consisting of copper, indium-tin oxide, indium-zinc oxide, aluminum-zinc oxide, titanium, aluminum molybdenum, cobalt, silver, gold, nickel, tungsten, chromium, hafnium, platinum, iron, and an alloy formed of a conductive element, and wherein the insulator material comprises an oxide.

* * * * *